(12) United States Patent
Filter et al.

(10) Patent No.: US 6,392,144 B1
(45) Date of Patent: May 21, 2002

(54) MICROMECHANICAL DIE ATTACHMENT SURCHARGE

(75) Inventors: William F. Filter; John P. Hohimer, both of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/516,666

(22) Filed: Mar. 1, 2000

(51) Int. Cl.⁷ .............................................. H01L 23/02
(52) U.S. Cl. ..................... 174/52.4; 174/52.1
(58) Field of Search ............................. 174/52.1, 52.4; 361/748, 756, 759, 760, 761, 764, 765, 784, 785, 803; 439/68, 75, 74, 78, 79, 82

(56) References Cited

U.S. PATENT DOCUMENTS

| | | | |
|---|---|---|---|
| 3,266,113 A | * 8/1966 | Flanagan, Jr. ................. 24/204 |
| 4,531,733 A | * 7/1985 | Hall .............................. 273/25 |
| 4,950,173 A | * 8/1990 | Minemura et al. ............. 439/82 |
| 5,119,531 A | * 6/1992 | Berger et al. .................. 24/576 |
| 5,312,456 A | 5/1994 | Reed et al. .................... 411/456 |
| 5,347,086 A | 9/1994 | Potter et al. .................. 174/261 |
| 5,396,687 A | * 3/1995 | Osterman ..................... 24/449 |
| 5,411,400 A | * 5/1995 | Subrahmanyan et al. ..... 439/68 |
| 5,501,893 A | 3/1996 | Laermer et al. ............. 428/161 |
| 5,532,519 A | 7/1996 | Bertin et al. ................. 257/777 |
| 5,567,653 A | 10/1996 | Bertin et al. ................. 437/173 |
| 5,676,850 A | 10/1997 | Reed et al. ...................... 216/2 |
| 5,712,190 A | 1/1998 | Bertin et al. ................. 437/173 |
| 5,783,340 A | 7/1998 | Farino et al. .................. 430/22 |
| 5,798,283 A | 8/1998 | Montague et al. ............. 438/24 |
| 5,804,084 A | 9/1998 | Nasby et al. .................... 216/2 |
| 5,806,152 A | 9/1998 | Saitou et al. .................. 24/662 |
| 5,813,095 A | * 9/1998 | Robertson ..................... 24/442 |
| 5,814,885 A | 9/1998 | Pogge et al. ................. 257/730 |
| 5,818,748 A | 10/1998 | Bertin et al. .................. 365/51 |
| 5,848,503 A | 12/1998 | Toft et al. ................... 52/173.1 |
| 5,903,059 A | 5/1999 | Bertin et al. ................. 257/785 |
| 5,919,548 A | 7/1999 | Barron et al. ................ 428/138 |
| 5,938,498 A | 8/1999 | Glynn ......................... 446/124 |
| 5,963,788 A | 10/1999 | Barron et al. .................. 438/48 |
| 5,988,511 A | 11/1999 | Schmidt et al. ............. 235/492 |
| 6,278,193 B1 | * 8/2001 | Coico et al. ................. 257/797 |

OTHER PUBLICATIONS

M.L. Reed, H. Han, and L.E. Weiss, "Silicon Micro–Velcro," *Advanced Materials*, vol. 4, No. 1, pp. 48–51, 1992.
H. Han, L.E. Weiss and M.L. Reed, "Micromechanical Velcro," *IEEE Journal of Microelectromechanical Systems*, vol. 1, No. 1, pp. 37–43, Mar. 1992.

* cited by examiner

Primary Examiner—Dean A. Reichard
Assistant Examiner—Carmelo Oliva
(74) Attorney, Agent, or Firm—John P. Hohimer

(57) ABSTRACT

An attachment structure is disclosed for attaching a die to a supporting substrate without the use of adhesives or solder. The attachment structure, which can be formed by micromachining, functions purely mechanically in utilizing a plurality of shaped pillars (e.g. round, square or polygonal and solid, hollow or slotted) that are formed on one of the die or supporting substrate and which can be urged into contact with various types of mating structures including other pillars, a deformable layer or a plurality of receptacles that are formed on the other of the die or supporting substrate, thereby forming a friction bond that holds the die to the supporting substrate. The attachment structure can further include an alignment structure for precise positioning of the die and supporting substrate to facilitate mounting the die to the supporting substrate. The attachment structure has applications for mounting semiconductor die containing a microelectromechanical (MEM) device, a microsensor or an integrated circuit (IC), and can be used to form a multichip module. The attachment structure is particularly useful for mounting die containing released MEM devices since these devices are fragile and can otherwise be damaged or degraded by adhesive or solder mounting.

37 Claims, 16 Drawing Sheets

Section 1 - 1

Section 2 - 2

Section 3 - 3

Section 4 - 4

MICROMECHANICAL DIE ATTACHMENT SURCHARGE

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to packaging of microelectromechanical (MEM) devices and integrated circuits (ICs), and more particularly to a micromachined structure for attaching one or more die containing a MEM device, an IC or a microsensor to a supporting substrate without the use of an adhesive or solder.

BACKGROUND OF THE INVENTION

Microelectromechanical (MEM) devices are microminiature devices formed on a substrate using fabrication process steps common to the integrated circuit (IC) fabrication industry. These MEM devices generally combine electrical and mechanical functionality to form many different kinds of electromechanical devices including accelerometers, sensors, motors, switches, relays, coded locks, micromirrors and microfluidic devices.

The fabrication of MEM devices is generally based on the deposition and photolithographic patterning of alternate layers of polycrystalline silicon (also termed polysilicon) and a sacrificial material such as silicon dioxide ($SiO_2$) or a silicate glass (e.g. deposited from the decomposition of tetraethylortho silicate, also termed TEOS). Vias can be etched through the sacrificial material to provide anchor points to the substrate and between adjacent polysilicon layers. The polysilicon layers can be patterned and built up layer by layer to form various members of the MEM device structure. Once the MEM device structure is completed, the sacrificial material is partially or completely removed (e.g. by exposure to a selective etchant which etches away the sacrificial material, but does not chemically attack the polysilicon layers) to release the polysilicon members of the MEM device for operation.

The MEM devices are preferably packaged after release; and in this released state, the MEM devices can be damaged or degraded by exposure to heat, chemicals or moisture. Traditional methods for attaching microelectronics devices in die form to an integrated circuit (IC) package include the use of solders (e.g. eutectic metals), and the use of adhesives (e.g. epoxy). MEM devices can be easily damaged after release by heating to an elevated temperature which is required when using solder for attachment of the MEM devices in die form to a package. As a result, the current practice is to use an epoxy to attach MEM devices in die form to an IC package. However, the evolution of chemicals from the epoxy over time can result in the degradation and/or failure of the sensitive MEM devices. Thus, there is a need for a packaging method for MEM devices that is not based on either the use of elevated temperatures or the use of adhesives in order to improve the reliability of packaged MEM devices over current technology.

An advantage of the present invention is that a mechanical attachment of a MEM device, a microsensor or an IC to a supporting substrate can be performed by micromachining a structure on a surface of the MEM device, microsensor or IC that mechanically interlocks with a complementary structure formed on a mating surface of the supporting substrate so that the attachment can be made without the use of any solder or adhesive.

Another advantage of the present invention is that a detachable attachment can be formed between the MEM device, microsensor or IC and the supporting substrate.

A further advantage is that one or more electrical interconnections can be made between the MEM device, microsensor or IC and the supporting substrate by electrically conducting portions of a micromachined die attachment structure formed according to the present invention.

Still another advantage of the present invention is that an alignment structure can be provided on the MEM device, microsensor or IC and the supporting substrate to aid in bringing the devices into precise alignment with the supporting substrate to facilitate attachment thereto.

These and other advantages of the method of the present invention will become evident to those skilled in the art.

SUMMARY OF THE INVENTION

The present invention relates to a micromechanical structure for attaching a pair of substrates together, with at least one of the substrates comprising a semiconductor. The attachment structure comprises a first plurality of shaped pillars of a substantially uniform width extending outward from and supported by a first surface of a first substrate of the pair of a substrates; and engagement means formed on a second surface of a second substrate of the pair of substrates for engaging with the outward-extending pillars and forming a mechanical attachment thereto when the first and second surfaces are urged together. The first substrate can be, for example, a semiconductor substrate (e.g. comprising silicon) whereon the MEM device, microsensor or IC is formed; and the second substrate can be the supporting substrate.

Each pillar of the first plurality of shaped pillars can be solid or hollow, and can have a cross-sectional shape in a plane parallel to the first surface that is arbitrarily shaped, and can be, for example, circular, elliptical or polygonal (e.g. square, rectangular, or hexagonal). Each pillar of the first plurality of shaped pillars can further comprise one or more materials selected from the group consisting of monocrystalline silicon, polycrystalline silicon, silicon nitride, silicon dioxide, silicate glasses, polyimide, metals and metal alloys. Additionally, each pillar of the first plurality of shaped pillars can be tapered at an unsupported end thereof and/or slotted along a portion of its length. Furthermore, a sidewall of each pillar of the first plurality of shaped pillars can be roughened or can include one or more ridges or notches formed thereabout to provide a stronger mechanical attachment between the MEM device, microsensor or IC and the supporting substrate. Finally, at least a portion of the first plurality of shaped pillars can be made electrically conductive to provide electrical interconnections between the MEM device, microsensor or IC and the supporting substrate.

The engagement means formed on the second surface of the second substrate (e.g. the supporting substrate) can comprise a second plurality of shaped pillars, with the second plurality of shaped pillars extending outward from and being supported by the second surface of the second substrate. Each pillar formed on the second substrate can be either substantially equal in size and shape to the pillars formed on the first substrate; or in the alternative, each pillar formed on the second substrate can be unequal in size and/or shape to the pillars formed on the first substrate. Each pillar formed on the second substrate can also be solid or hollow, can have a substantially uniform width, can be tapered at an unsupported end thereof, or can be slotted along a portion of its length. Each pillar formed on the second substrate can be adapted to fit adjacent to or around or within one of the pillars on the first substrate. To strengthen the interlocking or attachment between the first and second substrates, the pillars on one substrate can include one or more notches formed therearound; and the mating pillars on the other substrate can include one or more ridges formed therearound.

The attachment structure of the present invention can further include an optional alignment structure formed on the first and second substrates to aid in precisely positioning the first plurality of shaped pillars with the engagement means, thereby facilitating formation of the mechanical attachment therebetween. The alignment structure can comprise, for example, a plurality of shaped pegs formed on one of the first and second substrates, and a plurality of shaped recesses for receiving the shaped pegs formed on the other of the first and second substrates. The shaped pegs are larger in size than the shaped pillars and can be tapered at an unsupported end thereof, with the tapered end being substantially flat rather than pointed. The shaped recesses can have either substantially vertical sidewalls or sidewalls that are tapered inward at an angle with increasing depth. Each shaped peg can further have a length that exceeds the length of the pillars so that the shaped pegs come into contact with the mating substrate before the pillars are engaged. This helps to ensure that the attachment structure can be easily and simply positioned to bring the shaped pillars into position for subsequent engagement.

In other embodiments of the present invention, the engagement means can comprise a deformable layer formed above the second surface of the second substrate, with the deformable layer having a plurality of openings therethrough superposed with the first plurality of shaped pillars. In these embodiments of the present invention, the first plurality of shaped pillars can be as described previously, and optionally can be tapered at an unsupported end thereof, or optionally can include one or more ridges or notches formed about an outer sidewall thereof.

In yet other embodiments of the present invention, the engagement means can comprise an array of receptacles formed on the second substrate, with each receptacle further comprising a cavity that is adapted to receive a mating pillar of the first plurality of shaped pillars. Each receptacle can comprise a cavity having a width substantially equal to the width of the mating pillar, with each mating pillar being either solid or hollow and optionally being slotted along a portion of its length. Additionally, each receptacle optionally can include a notch or ridge formed about an inner sidewall of the cavity, with the mating pillar having a complementary ridge or notch formed about an outer sidewall thereof.

The present invention also relates to a structure for attaching at least one semiconductor die (e.g. comprising silicon) to a supporting substrate, with the attachment structure comprising a plurality of downward-extending pillars having a substantially uniform width formed on a lower surface of each semiconductor die in a spaced arrangement, and further comprising a plurality of upward-extending pillars formed on an upper surface of the supporting substrate. The upward-extending pillars are spaced for engagement with the downward-extending pillars to provide a mechanical attachment of each semiconductor die to the supporting substrate upon urging the die and substrate together. Each semiconductor die can further include a device such as microelectromechanical (MEM) device, an integrated circuit (IC) device or a microsensor device formed on or below a surface thereof (e.g. in a region of the semiconductor die that is free from the plurality of the downward-extending pillars).

The present invention is further related to a structure for attaching a pair of substrates together with at least one of the substrates being a semiconductor. The attachment structure can comprise a plurality of shaped pillars of a substantially uniform width extending downward from a first substrate of the pair of substrates; and a plurality of sockets or receptacles formed on or below a surface of a second substrate of the pair of substrates, with each socket or receptacle being adapted to receive and engage one of the pillars, thereby attaching the pair of substrates together. An alignment structure can optionally be provided for bringing the pair of substrates into precise alignment with each other. Such an alignment structure can comprise, for example, a plurality of shaped recesses formed into one of the pair of substrates and a plurality of shaped pegs formed in the other of the pair of substrates, with each shaped recess and each shaped peg having substantially equal lateral dimensions at one end thereof and substantially different lateral dimensions at the other end thereof (i.e. a mating end of each of the shaped recesses and shaped pegs can be tapered, the opposite end being untapered with substantially vertical sidewalls).

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly:pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
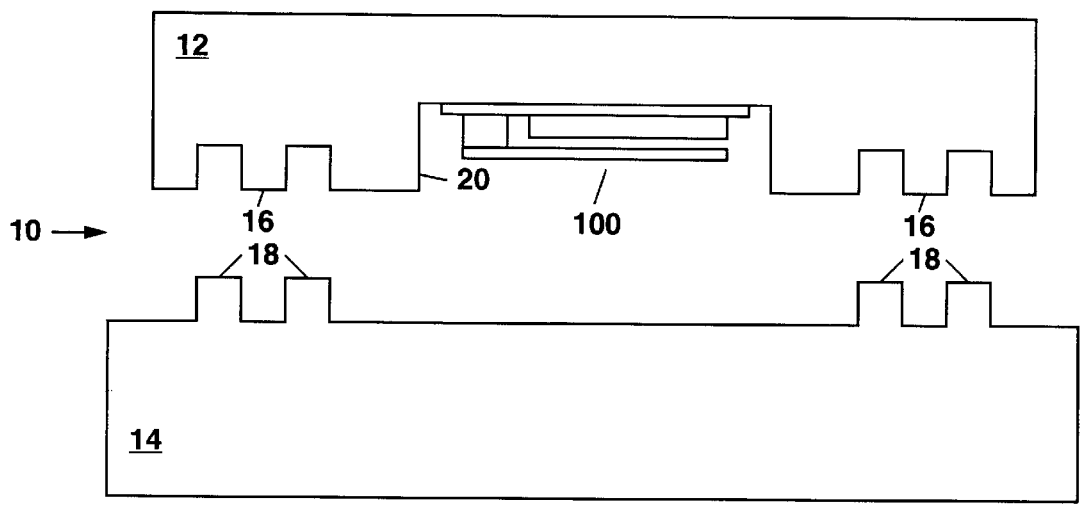
FIGS. 1A and 1B schematically illustrate a cross-sectional representation of a first example of the attachment structure of the present invention before and after engagement, respectively.
Figure 1B:
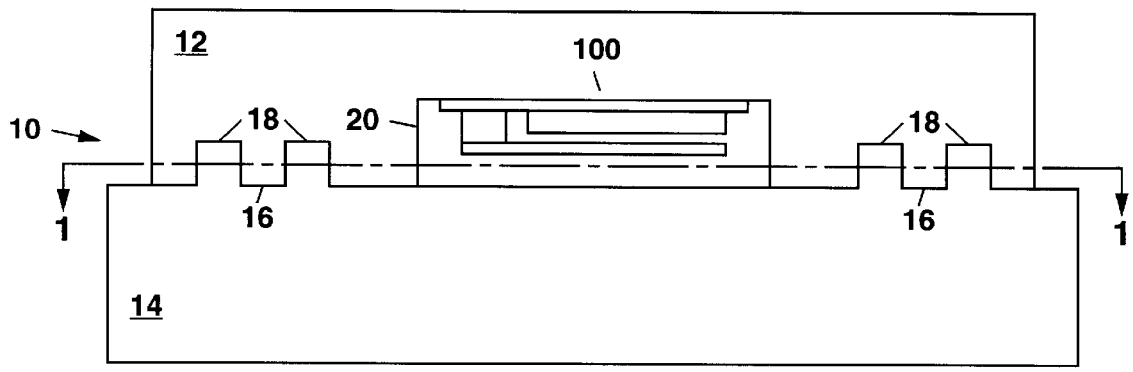
Figure 1C:
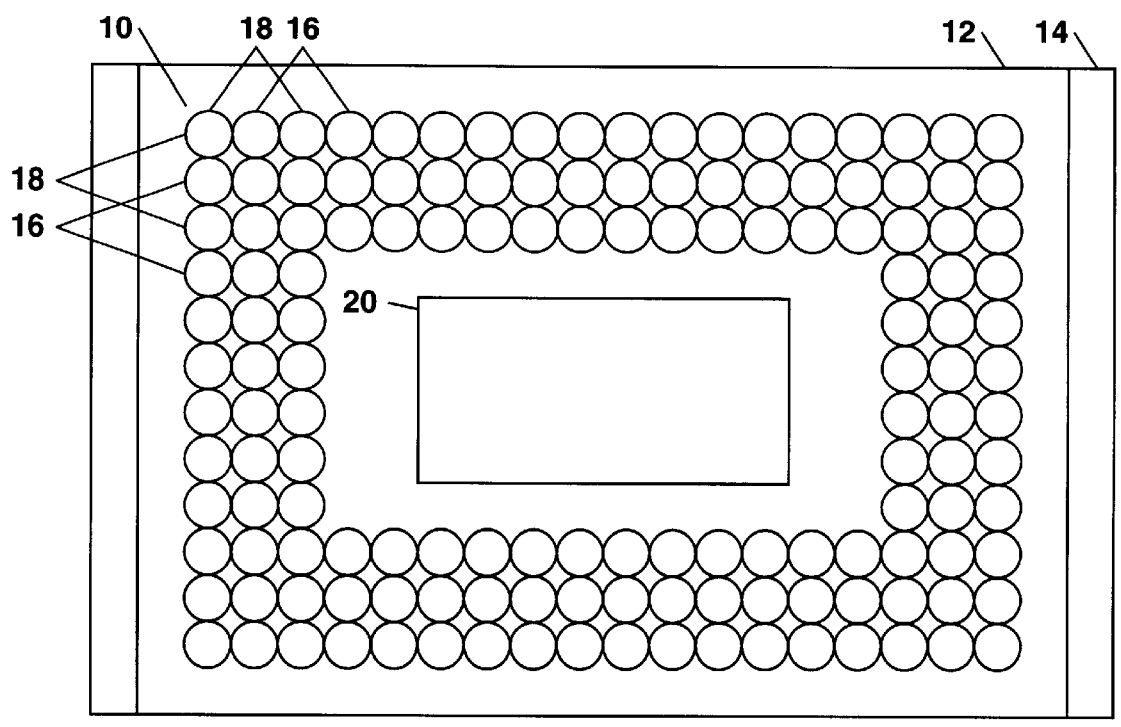
FIG. 1C shows a plan view of the engaged attachment structure along the section line 1—1 in FIG. 1B.

Referring now to the drawings, wherein like reference numerals refer to similar or identical parts throughout the several views, and more specifically to FIGS. 1A–1C thereof, there is shown schematically a first example of the attachment structure 10 of the present invention.

Each attachment structure 10 of the present invention is formed in part on a first substrate 12 (also referred to herein as a die) and in part on a second substrate 14 (also referred to herein as a supporting substrate) to which the die 12 is to be attached as a part of a packaging process. The die 12 can contain a MEM device 100 formed on or below a surface thereof; or alternately the die 12 can contain a microsensor or an integrated circuit (IC) formed thereon. In some cases, the die 12 can contain both a MEM device 100 or a microsensor together with integrated circuitry for control, signal processing or readout. Whereas the die 12 will generally comprise a semiconductor (e.g. silicon or a III–V compound semiconductor such as gallium arsenide), it is not necessary that the supporting substrate 14 be a semiconductor. The supporting substrate 14 can form a part of a conventional IC package or header, or can be attached to an IC package (not shown) prior to attachment of the die 12 to the supporting substrate 14. Such attachment of the supporting substrate 14 can be performed, for example, using a eutectic metal at an elevated temperature prior to attaching the die 12 to the supporting substrate 14. In this way, exposure of the sensitive MEM device 100 to the elevated temperature can be avoided, with the attachment of the die 12 containing the MEM device 100 to the supporting substrate 14 being purely mechanical without any solder or adhesive.

The attachment structure 10 in the example of FIGS. 1A–1C comprises a first plurality of shaped pillars 16 formed in or on a surface of the die 12 and extending outward therefrom, and a second plurality of shaped pillars 18 formed in or on a surface of the supporting substrate 14 and extending outward therefrom. The pillars 16 and 18 can be formed by patterning the surfaces of the substrates 12 and 14 using a material removal process, or alternately by using a material addition process wherein one or more layers of material are deposited on the surfaces of the substrates 12 and 14 and patterned to form the pillars 16 and 18. Those skilled in the art will understand that other processes are available which can be used to form the attachment structure 10 of the present invention. For example, a material conversion process in which a portion of a silicon substrate is converted to a thermal oxide (i.e. silicon dioxide) can be used to form at least a part of the attachment structure 10. As another example, an ion implantation process can be used to selectively implant portions of a silicon substrate with boron or phosphorous ions to allow patterning of the substrate by a subsequent selective etching process.

The terms "patterned" and "patterning" as used herein mean a series of semiconductor processing steps as known to the art including steps for applying a photoresist to a surface of the substrates 12 or 14 or to a material layer thereon, pre-baking the photoresist, aligning the substrate or layer covered with photoresist with a photomask (also termed a reticle), exposing and developing the photoresist to remove the photoresist at locations where particular features (e.g. one or more pillars 16 or 18) are to be formed, etching downward into a portion of the substrate or into one or more material layers thereon not protected by the photoresist, and removing the remaining photoresist so that further processing can take place. The terms "patterned" and "patterning" can also include the formation and removal of a hard mask (e.g. comprising a silicate glass) as needed.

The term "pillar" as used herein refers to a column or post that can be solid or hollow and of a substantially uniform width or tapered at an unsupported end thereof, but without any barbs that protrude laterally outward from the sides thereof.

In the example of FIGS. 1A–1C, the shaped pillars 16 and 18 can be meshed (i.e. engaged) when the die 12 and supporting substrate 14 are urged together. This forms a mechanical attachment due to frictional contact between the pillars 16 and 18 which are spaced in an alternating arrangement (see FIGS. 1B and 1C). The interlocking of the spaced pillars 16 and 18 provides a detachable connection which securely holds the die 12 in place under normal handling and use conditions, but which allows the die 12 to later be removed from the supporting substrate if necessary. The force required to detach the die 12 from the supporting substrate 14 will, in general, depend upon a number of factors including the tolerances used in manufacturing the pillars 16 and 18, the surface roughness of the pillars 16 and 18, and the number and shape of the pillars 16 and 18.

In FIG. 1C, the pillars 16 and 18 are each shown as having a circular cross-section shape in a plane parallel to the surface whereon the pillars 16 or 18 are formed. The pillars 16 and 18 are also arranged in interlocking arrays so that each pillar 16 on the die 12 contacts a plurality of pillars 18 on the supporting substrate 14 upon engagement. In other embodiments of the present invention, different cross-sectional shapes for the pillars 16 and/or 18 can be provided. For example, one or both types of pillars 16 and 18 can have an elliptical or polygonal (e.g. triangular, square, rectangular or hexagonal) cross-section shape. Other arbitrary shapes and sizes can be selected for the pillars 16 and 18. All that is needed is that the pillars 16 and 18 be capable of being interlocked together. Furthermore, it is not necessary that the two types of shaped pillars 16 and 18 have the same cross-sectional shape. The shapes selected for the pillars 16 and 18 need only be arranged so that they mesh together upon contact and applied mounting pressure to form a mechanical attachment between the die 12 and the supporting substrate 14.

Engagement of the pillars 16 and 18 can also be facilitated by tapering the unsupported ends of one or both of the pillars 16 and 18. Additionally, one or both types of the pillars 16 and 18 can be made hollow and can also be optionally slotted along a portion of the length thereof to provide some flexibility or springiness to facilitate engagement of the pillars 16 and 18 (see FIG. 5C). Finally, to further increase a strength of attachment of the die 12 to the supporting substrate 14, a sidewall of the pillars 16 or 18 can be roughened; or alternately one or more ridges or notches can be formed around a sidewall of the pillars 16 or 18 (see FIGS. 4A–4F). If, for example, the pillars 16 have ridges formed thereabout (see FIG. 4A), then the mating pillars 18 can be formed with complementary notches (see FIG. 4C) which engage with the ridges to increase the strength of attachment of the die 12 to the supporting substrate 14.

FIGS. 2A–2D schematically illustrate in cross-section view a series of process steps for forming the first plurality of shaped pillars 16 on the die 12 by a material removal process which removes material from the die 12 which generally comprises a semiconductor (e.g. monocrystalline silicon) to form the pillars 16. In the example of FIGS. 1A–1C, the second plurality of shaped pillars 18 on the supporting substrate 14 can be formed using either the material removal process or a material addition process which will be described hereinafter with reference to FIGS. 3A–3D. Those skilled in the art will understand that the pillars 16 and 18 can be formed either by the material removal process or by the material addition process. It will be further understood by those skilled in the art that the process steps described herein have been limited for clarity to only those steps that are essential for understanding the present invention and do not include other process steps which are well known to the semiconductor and micromachining art and, therefore, need not be described in detail herein.

Figure 2A:
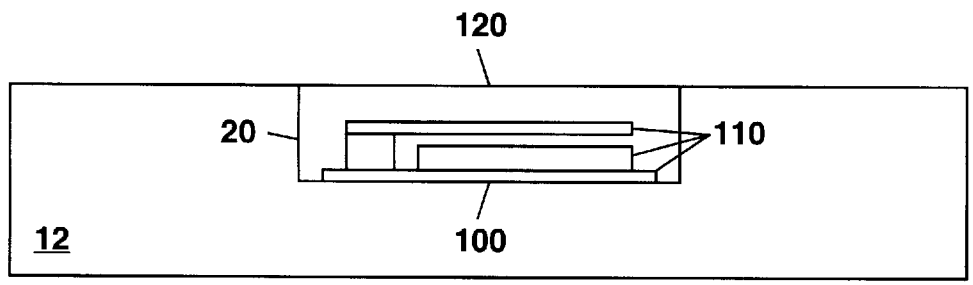
FIGS. 2A–2D schematically illustrate a material removal process for forming a part or the entirety of the attachment structure of FIG. 1.

In FIG. 2A, a MEM device 100 is fabricated in a cavity 20 etched into the die 12 using a series of conventional micromachining steps as known to the art including successive depositions and patterning of a plurality of layers of polycrystalline silicon 110 (also termed polysilicon) and a sacrificial material 120 such as silicon dioxide or a silicate glass (e.g. deposited from the decomposition of tetraethylortho silicate, also termed TEOS, and densified by heating to a high temperature). The successive depositions and patterning of the layers of polysilicon 110 and the sacrificial material 120 build up a particular structure (e.g. an accelerometer structure comprising a cantilevered beam suspended above a capacitive sense electrode) of the MEM device 100 being formed. Once the structure of the MEM device 100 has been built up, one or more additional layers of the sacrificial material 120 can be deposited to fill in the cavity 20, thereby encapsulating the MEM device 100. Any of the sacrificial material extending outward above the cavity or over the surface of the die 12 can be removed by chemical-mechanical polishing (CMP). Those skilled in the art will understand that although the MEM device 100 is described as being formed in a cavity, it can also be formed on or above a surface of the die 12 using conventional surface micromachining methods. Further details about the fabrication of MEM devices 100 are disclosed, for example, in U.S. Pat. Nos. 5,783,340; 5,798,283; 5,919,548; and 5,963,788 which are incorporated herein by reference.

Figure 2B:
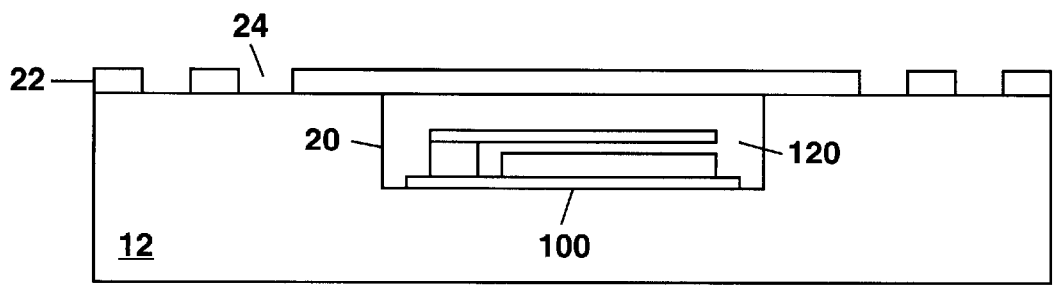

In FIG. 2B, an etch mask 22 is formed over the die 12 and patterned to provide a plurality of openings 24 therethrough. The etch mask 22 can comprise, for example, about 500 nanometers of TEOS that has been patterned by reactive ion etching using an overlying photoresist mask (not shown) which is subsequently removed to leave the etch mask 22 in place.

Figure 2C:
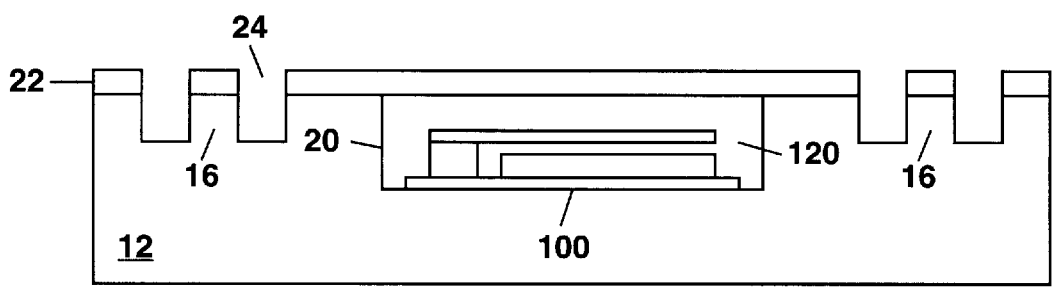

In FIG. 2C, an anisotropic etching step (e.g. reactive ion etching) is used to etch down into the underlying die 12 through the openings 24 in the etch mask 22, thereby forming the plurality of shaped pillars 16 at selected locations protected by the overlying etch mask 22. The reactive ion etching step produces sidewalls on the pillars 16 that are substantially vertical or tapered slightly inward at the top thereof (i.e. at an unsupported end of the pillars 16). The etch depth can be, for example, 2–200 $\mu$m or more and will generally depend upon the lateral dimensions of the pillars 16 or 18 being formed which can be, for example, in the range of 5–1000 $\mu$m.

Reactive ion etching to depths in the range of about 2–20 $\mu$m can be accomplished using conventional reactive ion etching methods. Alternately, etching to depths greater than about 20 $\mu$m can be accomplished by using a deep reactive ion etching process which combines multiple anisotropic etching steps with steps for simultaneously depositing an isotropic polymer/inhibitor to minimize lateral etching. This deep reactive ion etching process is disclosed in U.S. Pat. No. 5,501,893 to Laermer et al, which is incorporated herein by reference.

Figure 2D:
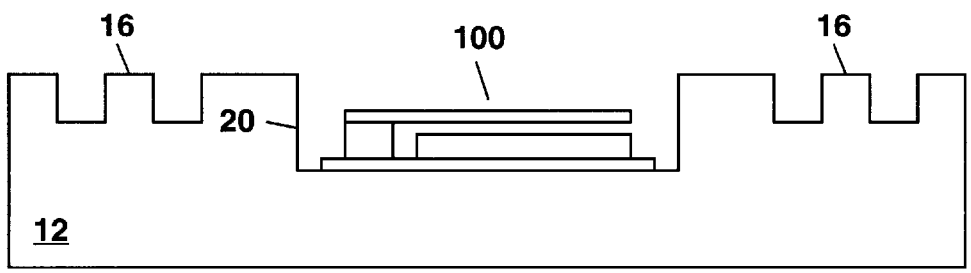

In FIG. 2D, the etch mask 22 and sacrificial material 120 filling the cavity 20 are removed. This can be done, for example, by etching away a TEOS etch mask 22 with a selective wet etchant comprising hydrofluoric acid (HF) which attacks silicon dioxide or silicate glasses while not substantially attacking silicon which is generally used for the substrates 12 and 14 and also for forming the structure of the MEM device 100. Thus, by continuing the etching step used for removing the TEOS etch mask 22, the sacrificial material 120 can also be removed over time, thereby releasing the MEM device 100 for operation. In FIG. 2D, once the etch mask 22 has been removed and the MEM device 100 released for operation, the die 12 is ready for mounting on the supporting substrate 14 as shown in FIGS. 1B and 1C.

FIGS. 3A–3D schematically illustrate an alternative process which can be used to form the attachment structure 10 in the example of FIG. 1. This alternative process is based on the addition of material to the die 12 or supporting substrate 14 in the form of one or more deposited and patterned layers. These deposited and patterned layers can comprise one or more materials including polycrystalline silicon (i.e. polysilicon), silicon nitride, silicon dioxide, silicate glasses, polyimide, metals (e.g. aluminum or tungsten) and metal alloys. In FIGS. 3A–3D, the material addition process will be described with reference to formation of the shaped pillars 18 on the supporting substrate 14, although it will be understood by those skilled in the art that this same process can be used to form the pillars 16 on the die 12.

Figure 3A:
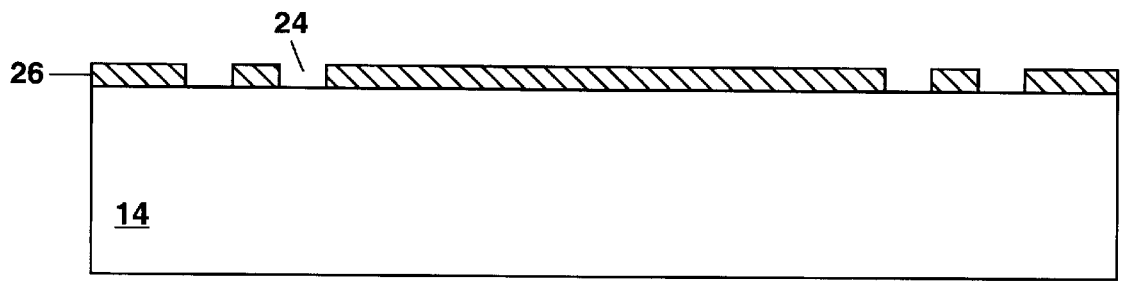
FIGS. 3A–3D schematically illustrate an alternative material addition process for forming a part or the entirety of the attachment structure of FIG. 1.

In FIG. 3A, a first layer of a sacrificial material 26 (e.g. silicon dioxide or a silicate glass) is blanket deposited over the supporting substrate 14 and patterned to provide a plurality of openings 24 therethrough at the locations of the shaped pillars 18 to be formed. The first layer of the sacrificial material 26 can be, for example, about 0.5–2 $\mu$mm thick.

Figure 3B:
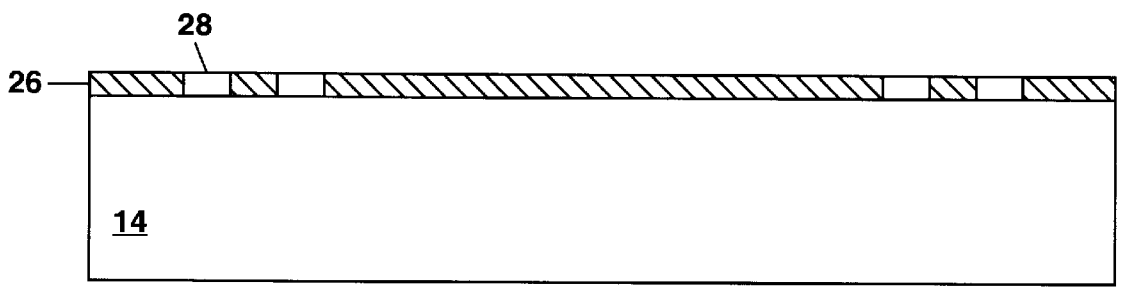

In FIG. 3B, a layer of a pillar-forming material 28 (e.g. polysilicon, silicon nitride, polyimide, or a metal or metal alloy) is blanket deposited over the patterned first layer 26 and into the openings 24 to a depth that generally exceeds the thickness of the first layer 26. In the case of a polysilicon pillar-forming material 28, the deposition can be performed by low-pressure chemical vapor deposition (LPCVD) at a temperature of about 580° C. In the case of a polyimide pillar-forming material 28, the polyimide can be spun on over the supporting substrate 14 and subsequently cured by heating. And, in the case of a metal or metal alloy pillar-forming material 28, the metal or metal alloy can be deposited by evaporation, sputtering or plating. After deposition of the pillar-forming material 28, any excess material overlying the first layer of the sacrificial material 26 can be removed by either masking off the pillar-forming material 28 deposited in the openings 24 and etching away the remaining pillar-forming material 28, or alternately using CMP to remove any of the pillar-forming material 28 overlying the first layer of the sacrificial material 26. The use of CMP, which is described in U.S. Pat. No. 5,804,084 to Nasby and incorporated herein by reference, produces a globally planarized surface for the supporting substrate 14.

After planarizing the supporting substrate 14, the pillar-forming material 28 can be annealed if necessary to remove any residual stress therein. In the case of a polysilicon pillar-forming material 28, the annealing step can be carried out at a temperature of about 1100° C. for several hours (e.g. 3 hours).

Figure 3C:
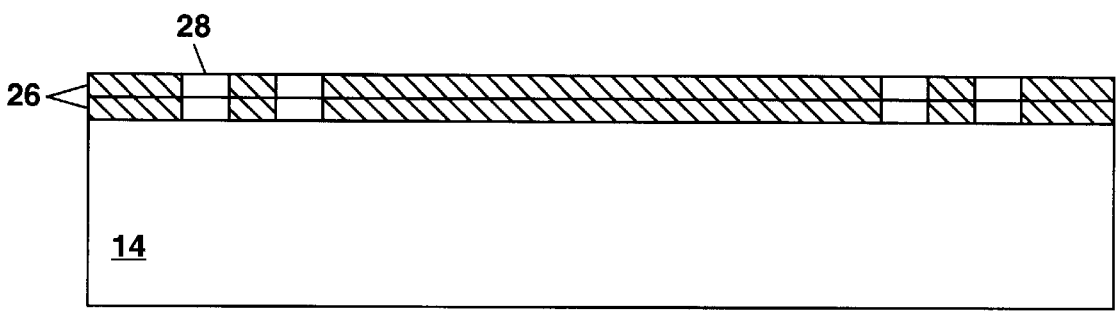

In FIG. 3C, a second layer of the sacrificial material 26 is blanket deposited over the substrate 14 and patterned as described with relation to FIG. 3A. A second layer of the pillar-forming material 28 is then deposited to fill in the openings 24 and any excess overlying the sacrificial material 26 is removed as described with relation to FIG. 3B. The steps of FIGS. 3A and 3B can be repeated as many times as are necessary to build up the structure of the shaped pillars 18 to a predetermined length subject to limitations imposed by residual stress which cannot be removed by annealing.

Figure 3D:
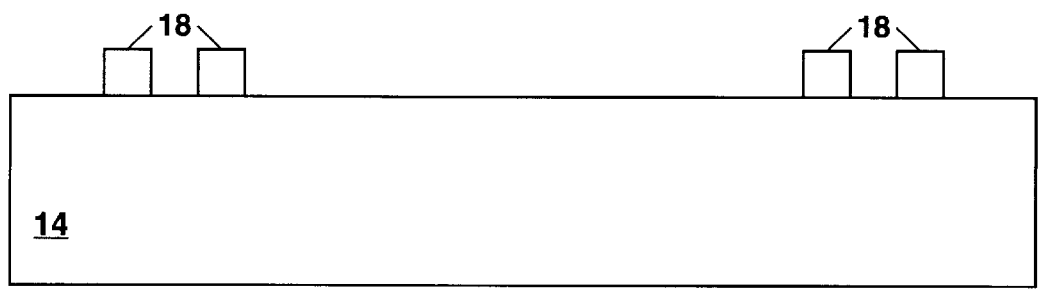

In FIG. 3D, the sacrificial material 26 is removed by exposure to a selective wet etchant (e.g. comprising HF) to leave the shaped pillars 18 standing on the surface of the supporting substrate 14.

In building up the shaped pillars 18 using the material addition process of FIGS. 3A–3D, it is not necessary that the pillars 18 have a uniform composition since different pillar-forming materials can be used to form different of the deposited layers from which the pillars 18 are built up. Additionally, it is not necessary that the pillars 18 have a uniform width along their entire length. Slight variations in the lateral dimensions of one or more of the deposited layers of the pillar-forming materials can be used to taper the pillars 18, to roughen the sidewalls of the pillars 18, or to form one or more internal or external ridges or notches about the sidewalls of the pillars 18. These slight variations in the lateral dimensions of the pillars 18 can increase the force required to remove the die 12 from the supporting substrate 14 once the attachment therebetween is made.

FIGS. 4A–4F illustrate representative examples of different cross-sectional shapes in which the pillars 16 or 18 can be formed by varying the sizes of the openings 24 formed in successive layers of sacrificial material 26 of differing thicknesses during build-up of the structure of the pillars 16 or 18 using the material addition process of FIGS. 3A–3D. In each of the examples of FIGS. 4A–4F, only an enlarged side view of the pillar 18 is shown with the supporting substrate 14 being omitted for clarity. In practice, the bottom end of each pillar 18 in FIGS. 4A–4F will be attached to the supporting substrate 14 (not shown); and the top end of the each pillar 18 will be unsupported. Although not shown in FIGS. 4A–4F, each of the pillars 16 or 18 can include one or more optional slots formed along a length thereof.

Figure 4A:
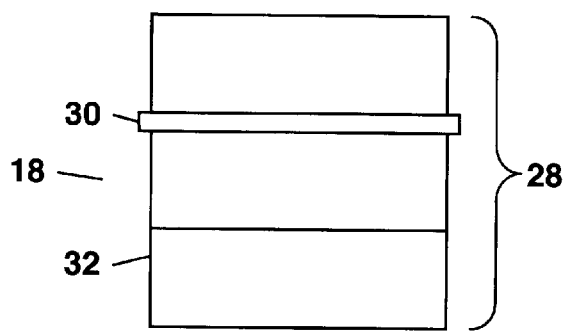
FIGS. 4A–4F schematically illustrate in cross-section view representative examples of different types of shaped pillars that can be formed according to the present invention.

In FIG. 4A, a plurality of layers of the same or different pillar-forming materials 28 are deposited in the openings 24 formed in successive layers of the sacrificial material 26 as shown in FIGS. 3A–3D. By varying the thicknesses of the successive layers of the sacrificial material 26 and the sizes of the openings 24 formed therein, the pillars 18 can be shaped to form one or more ridges 30 that extend laterally outward from an outer sidewall 32 of each pillar 18.

Figure 4B:
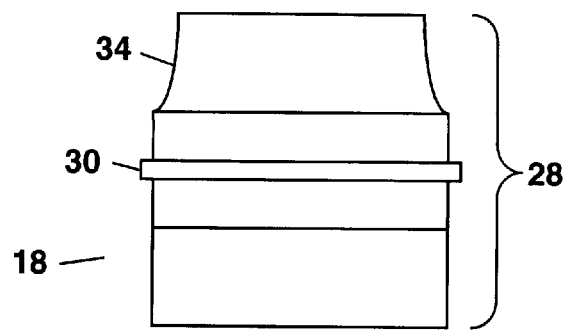

In FIG. 4B, each pillar 18 can be formed with a tapered ridged shape by anisotropically etching a plurality of openings 24 of the same or different sizes in each of the first four deposited sacrificial layers 26 as described with reference to FIG. 4A. This forms a substantially vertical sidewall portion of the pillars 18 with one or more ridges 30 extending laterally outward therefrom. A tapered sidewall portion 34 can then be formed at an unsupported end (i.e. the top end) of each pillar 18 by isotropically etching the opening 24 into one or more of the topmost layers of the sacrificial material 26. Such isotropic etching can be performed, for example, with a plasma.

Figure 4C:
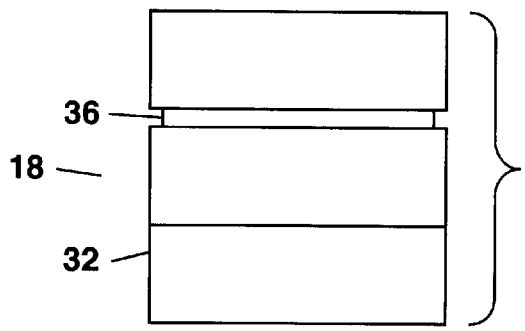

In FIG. 4C, a plurality of pillars 18 can be formed with one or more notches 36 formed about the outer sidewall 32 thereof by using a process similar to that described with reference to FIG. 4A except with one or more openings 24 formed in the layers of the sacrificial material 26 being smaller in size than the remaining openings 24. In this way, particular layers of the pillar-forming material 28 can be formed with smaller lateral dimensions than the remaining layers of the pillar-forming material 28, thereby producing a plurality of notched pillars 18.

Figure 4D:
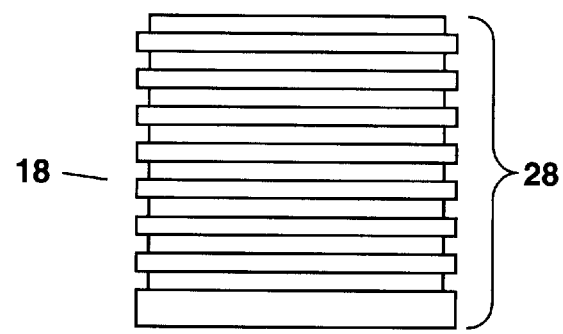

In FIG. 4D, a plurality of pillars 18 can be formed with a roughened-sidewall shape by periodically varying the size of the openings 24 formed in a plurality of layers of sacrificial material 26 having thicknesses that are relatively thin compared to the width of the openings 24.

Figure 4E:
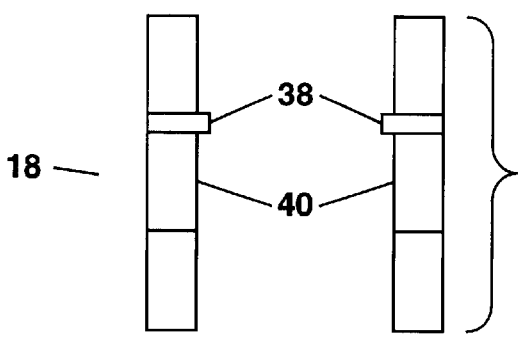
Figure 4F:
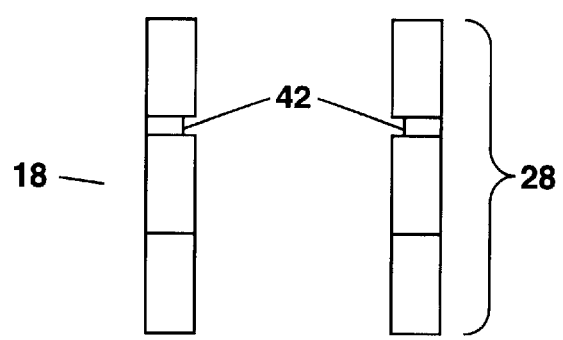

In FIGS. 4E and 4F, a plurality of annular-shaped openings 24 can be formed in the layers of sacrificial material 26 to form hollow pillars 18. By varying the size of the annular-shaped openings 24, which serve as molds for subsequently deposited layers of the pillar-forming material 28, the structures of the hollow pillars 18 shown in FIGS. 4E and 4F can be constructed. In FIG. 4E, one or more inside ridges 38 can be formed protruding outward from an inner sidewall 40 of each hollow pillar 18 towards a central axis thereof; whereas in FIG. 4F, one or more inside notches 42 can be formed extending inward from the inner sidewall 40 away from the central axis.

Figure 5A:
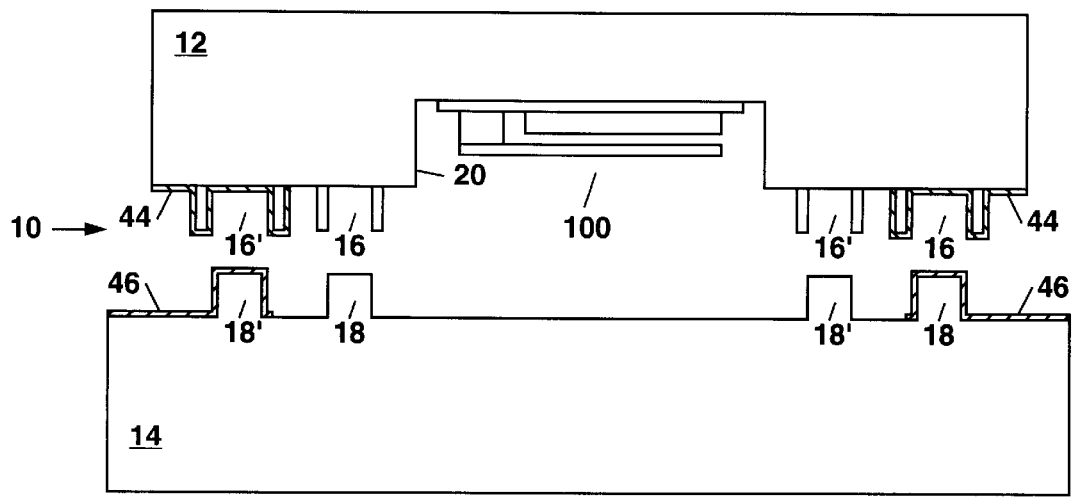
FIGS. 5A and 5B schematically illustrate a cross-sectional representation of a second example of the attachment structure of the present invention before and after engagement, respectively.
Figure 5B:
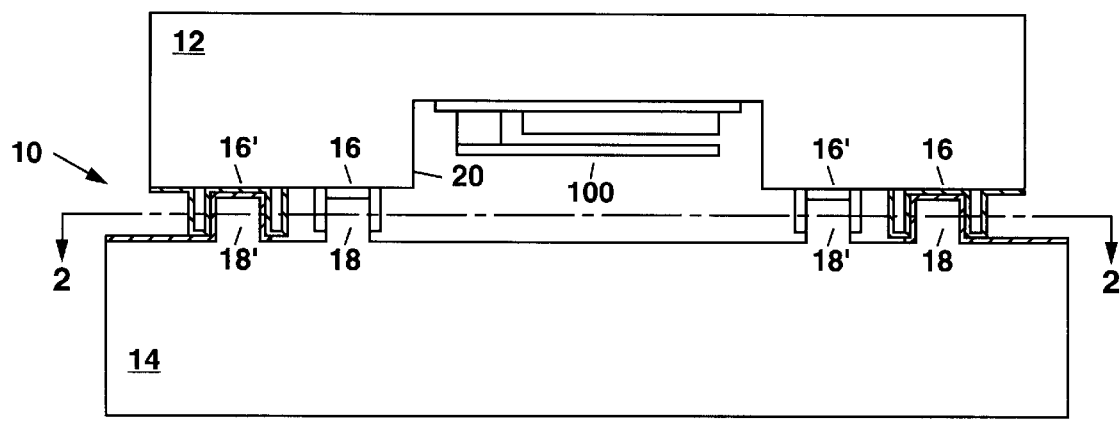
Figure 5C:
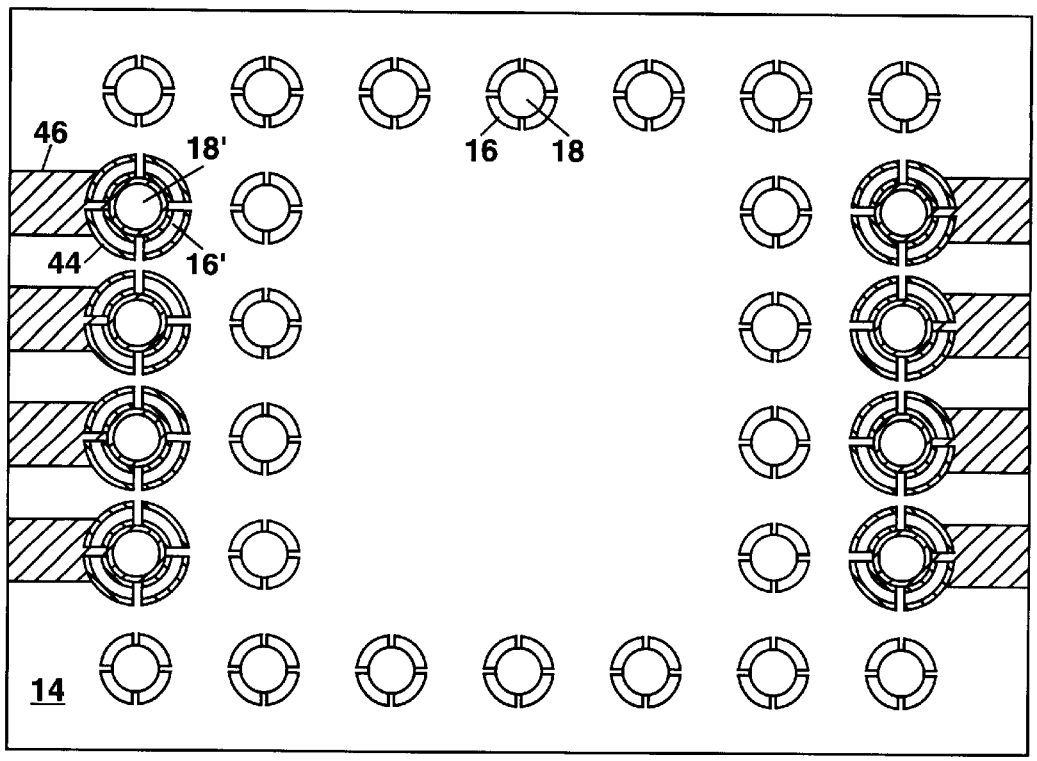
FIG. 5C shows a plan view of the engaged attachment structure along the section line 2—2 in FIG. 5B.

FIGS. 5A–5C show a second example of the attachment structure 10 of the present invention. In this second example of the attachment structure 10, a plurality of hollow pillars 16 and 16' are formed on a die 12 which also includes a MEM device 100 formed in a cavity 20 using conventional micromachining processes as known to the art. The attachment structure 10 further includes a plurality of solid pillars 18 and 18' that are formed on a supporting substrate 14, with the solid pillars 18 and 18' mating with the hollow pillars 16 and 16' to attach the die 12 to the supporting substrate 14 without the need for any solder or adhesive. A portion of the hollow pillars indicated as 16' and a portion of the solid pillars indicated as 18' are made electrically conductive and thereby provide electrical interconnections between the die 12 and the supporting substrate 14 (e.g. to provide a plurality of electrical inputs or outputs to or from the MEM device 100, or to or from electronic circuitry fabricated on the die 12). The formation of such electrical interconnections can in some instances completely eliminate the need for wire bonding to the die 12.

In FIG. 5A, the die 12 and supporting substrate 14 are shown after fabrication but prior to assembly. FIG. 5B shows the die 12 attached to the supporting substrate 14 using the attachment structure 10. This can be accomplished by aligning the hollow pillars 16 and 16' directly over the solid pillars 18 and 18' and then urging the two substrates 12 and 14 together (e.g. using a conventional "pick and place" apparatus). Frictional contact between the hollow pillars 16 and 16' and the solid pillars 18 and 18' then holds the die 12 in place on the supporting substrate 14 under conditions of normal use.

FIG. 5C shows schematically a plan view along section line 2—2 of FIG. 5B to illustrate that some or all of the hollow pillars, 16 and 16' can be slotted along their length as an aid in attaching the die 12 to the supporting substrate 14. Providing one or more slots in the hollow pillars 16 and 16' increases their springiness and allows an inner diameter of the hollow pillars 16 and 16' to be made more nearly equal to an outer diameter of the mating solid pillars 18 and 18'. FIG. 5C also shows a die metallization 44 and a supporting substrate metallization 46 which are deposited and patterned to cover the pillars 16' and 18', respectively, and to form electrical wiring on the die 12 and on the supporting substrate 14 (e.g. for making the electrical interconnections between the die 12 and substrate 14, and optionally for making electrical connections to a plurality of bond pads on the substrate 14). The die metallization 44 and the substrate metallization 46 can comprise aluminum or tungsten or an alloy thereof with the deposition being by evaporation, sputtering or plating to a layer thickness of, for example, 100–200 nanometers. In other embodiments of the present invention such electrical wiring can be formed by doping one or more polysilicon layers used to form the pillars 16'. This can be done by thermally diffusing or ion implanting a dopant species such as boron or phosphorous into the polysilicon.

The hollow pillars 16 and 16' and the solid pillars 18 and 18' can be formed, for example, using the material addition process as described previously with reference to FIGS. 3A–3D. Prior to fabrication of the pillars 16 and 18, an insulating layer (e.g. 100–300 nm of silicon nitride) can be blanket deposited over the die 12 and supporting substrate 14 to provide electrical insulation for the subsequently deposited die metallization 44 and supporting substrate metallization 46. The pillars 16 and 18 can then be built up layer by layer as described in FIGS. 3A–3D. After formation of the pillars 16 and 18, the various layers of sacrificial material 26 can be removed by a selective wet etchant (e.g. comprising HF) with the blanket insulating layer (e.g. silicon nitride) being resistant to chemical attack by the selective wet etchant and acting as an etch stop. The die metallization 44, (e.g. aluminum or tungsten or an alloy thereof) can then be deposited over the die 12' by evaporation, sputtering or plating and can be patterned by etching (e.g. reactive ion etching) or lift-off to form a plurality of electrically-conducting hollow pillars 16'.

After formation of the electrically-conducting hollow pillars 16', a portion of the blanket insulating layer overlying the encapsulated MEM device 100 can be removed (e.g. by reactive ion etching), or alternately a plurality of openings can be formed through the blanket insulating layer. This exposes the sacrificial material 120 in the cavity 20 so that it can be removed, at least in part, by a second selective wet etching step (e.g. using an etchant comprising HF) to release the MEM device 100 for operation. The die metallization 44 is generally selected to be chemically resistant to the etchant, but can be covered by a protective overlayer (e.g. silicon nitride) during the second wet etching step if this is necessary. The supporting substrate metallization 46 can be formed similarly to the die metallization 44 except that a second wet etching step is generally not required.

Figure 6A:
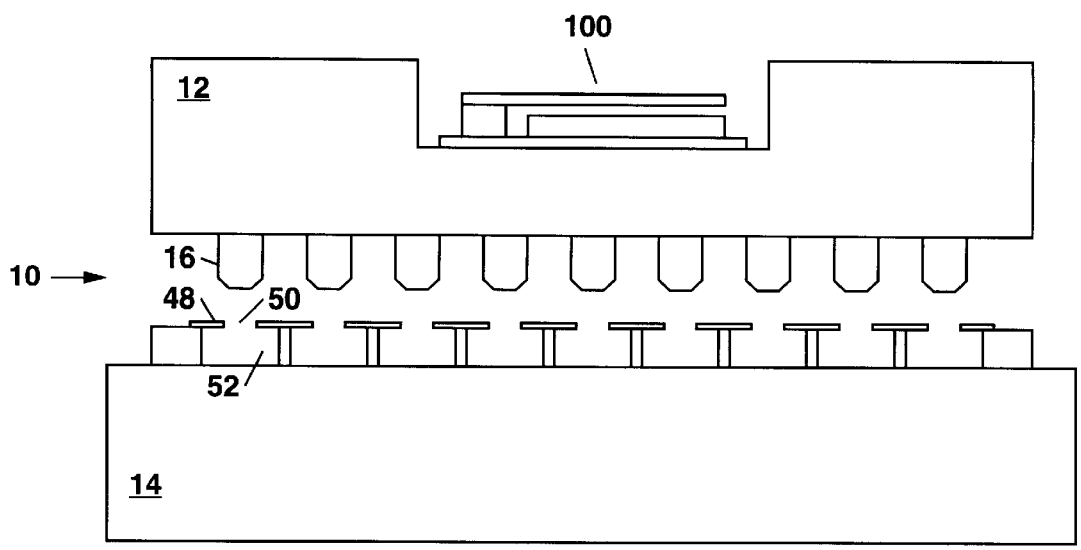
FIGS. 6A and 6B schematically illustrate a cross-sectional representation of a third example of the attachment structure of the present invention before and after engagement, respectively.
Figure 6B:
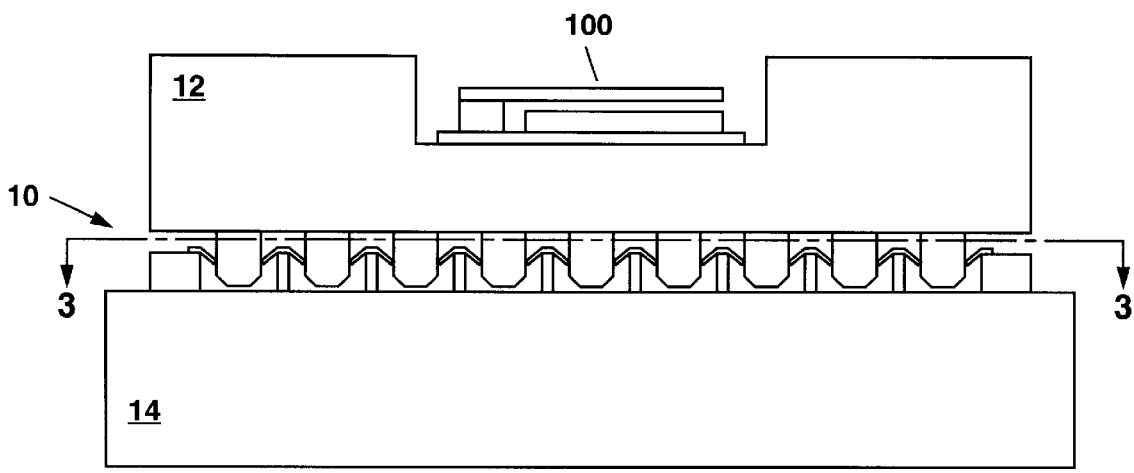
Figure 6C:
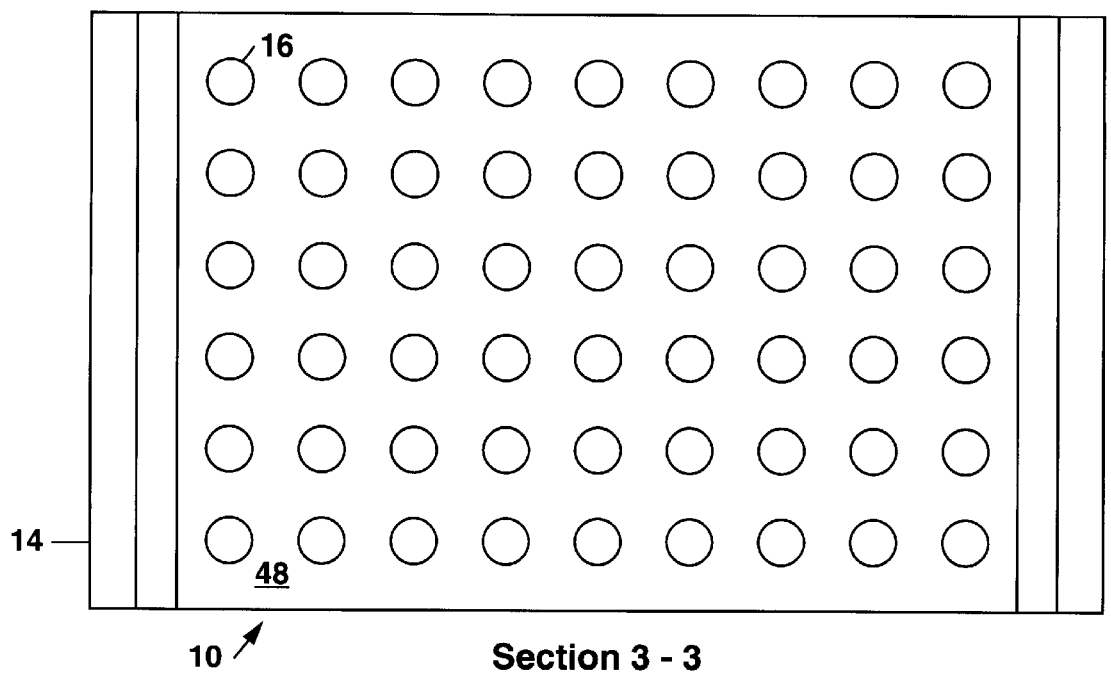
FIG. 6C shows a plan view of the engaged attachment structure along the section line 3—3 in FIG. 6B.

FIGS. 6A–6C show a third example of the attachment structure 10 of the present invention. In this third example of the attachment structure 10, a plurality of tapered pillars 16 are arrayed on a lower surface of a die 12 which further includes a MEM device 100 as shown, or alternately a microsensor or integrated circuitry. The attachment structure 10 further includes a deformable layer 48 which is formed above the supporting substrate 14 and contains a plurality of openings 50 that are superposed with the tapered pillars 16 on the die 12, with the openings 50 having a width that is slightly smaller than the width of the pillars 16. The openings 50 can be shaped similarly to the pillars 16 (e.g. round as shown in FIG. 6C), or alternately can have a different shape (e.g. square) from that of the pillars 16. An undercut cavity 52 underlies each opening 50 through the deformable layer 48 so that upon urging the die 12 towards the supporting substrate 14 each tapered pillar 16 penetrates through one of the openings 50 deforming the layer 48 downward slightly as shown in FIG. 6B. This slight downward deformation of the layer 48 serves to capture the pillars 16 and to provide resistance to release of the pillars 16, thereby resulting in the die 12 being firmly attached to the supporting substrate 14. A schematic plan view of the attachment structure 10 is shown in FIG. 6C along the section line 3—3 of FIG. 6B.

Fabrication of the tapered pillars 16 on the die 12 can be carried out in a manner similar to that previously described with reference to FIGS. 3A–3D and 4B, with the tapered pillars 16 optionally having one or more ridges or notches formed thereabout. Each tapered pillar 16 can have a width that is generally in the range of about 5–1000 μm. The exact size, number and location of the pillars 16 and the corresponding openings 50 through the deformable layer 48 can be selected to provide a predetermined strength of the attachment of the die 12 to the supporting substrate 14.

A process for fabricating the deformable layer 48 on the supporting substrate 14 by a material addition process is shown schematically in cross-section view in FIGS. 7A–7E.

Figure 7A:
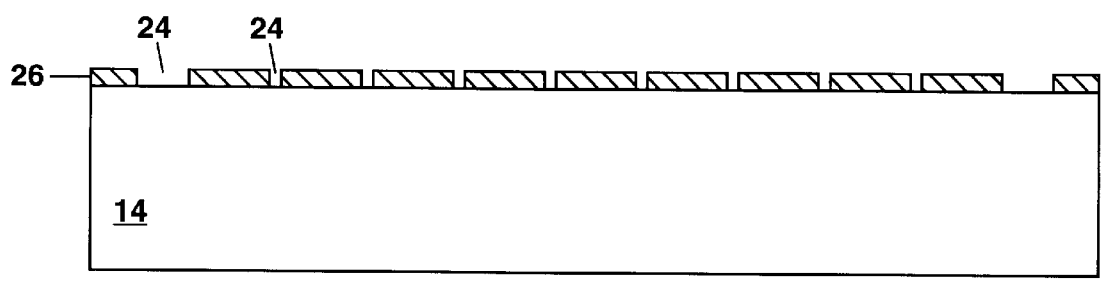
FIGS. 7A–7E schematically illustrate a process for fabricating a deformable layer on the supporting substrate to form a part of the attachment structure of FIGS. 6A–6C.

In FIG. 7A, a first layer of a sacrificial material 26 (e.g. silicon dioxide or a silicate glass such as TEOS) is blanket deposited over the supporting substrate 14 to a thickness of generally 1–2 μm and patterned to provide a plurality of shaped openings 24 therethrough. The openings 24 can be, for example, circular, square or rectangular with a spacing between adjacent openings 24 of, for example, about 1.5–2 times the width of the tapered pillars 16.

Figure 7B:
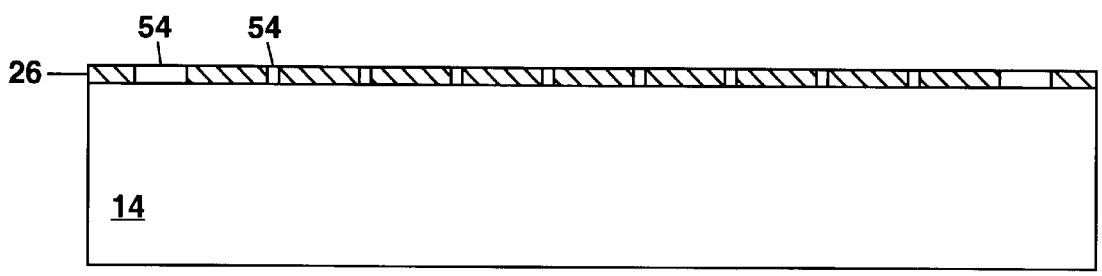

In FIG. 7B, a support material 54 (e.g. polysilicon) is deposited to fill in the openings 24. Any of the support material 54 overlying the first layer of the sacrificial material 26 can be removed by etching or CMP. At this point, an annealing step (e.g. 1100° C. for three hours) can be carried out if necessary to remove any residual stress in the support material 54.

Those skilled in the art will understand that the order of depositing and patterning the layers of the sacrificial material 26 and the support material 54 are a matter of choice so that each layer of the support material 54 can alternately be deposited first and patterned to provide a plurality of openings 24 therethrough at selected locations wherein the sacrificial material 26 is to be deposited, with the openings 24 in this case being sized to be the same as the undercut cavities 52 to be formed. After blanket deposition of a layer of the sacrificial material 26 to fill in the openings 24 any excess sacrificial material 26 overlying the deposited support material 54 can be removed by masking and etching, or alternately by CMP The result is the same as shown in FIG. 7B.

Figure 7C:
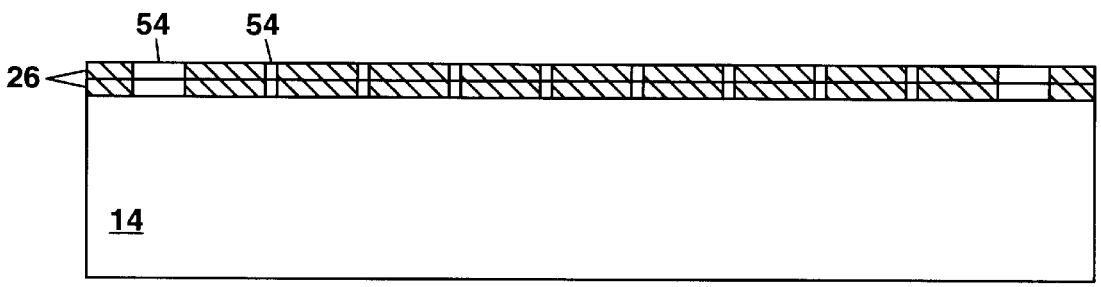

In FIG. 7C, the deposition and patterning steps of FIGS. 7A and 7B are repeated as many times as needed to build up the support material 54 to a predetermined thickness, which can be, for example, about 2–20 μm or more.

Figure 7D:
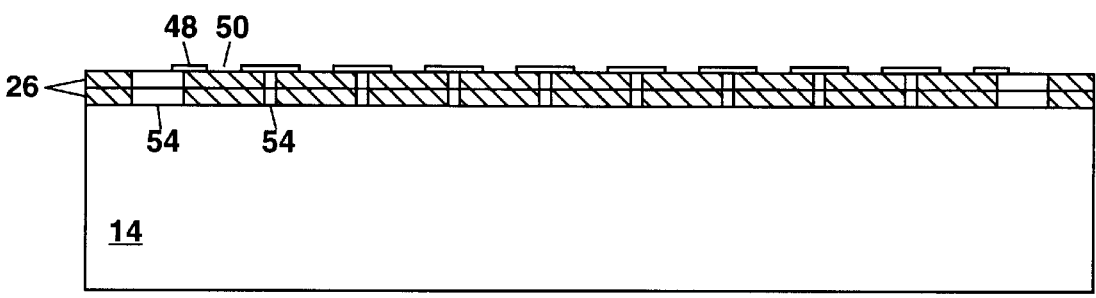

In FIG. 7D, the deformable layer 48 is blanket deposited over the sacrificial material 26 and the support material 54. The deformable layer 48 can comprise, for example, polysilicon, silicon nitride, polyimide or a metal (e.g. aluminum or an alloy thereof) with a layer thickness of, for example, 0.2–2 μm depending upon the width selected for the tapered pillars 16. After the deformable layer 48 has been deposited, the layer 48 is patterned to provide a plurality of openings 50 therethrough. This can be done, for example, by reactive ion etching.

Figure 7E:
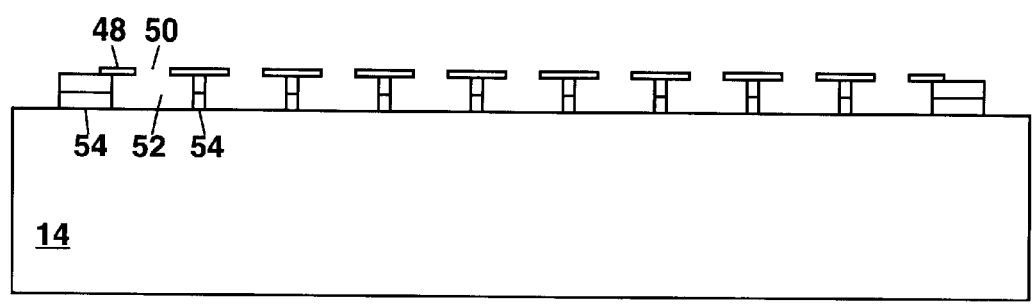

In FIG. 7E, the sacrificial material 26 is removed from the supporting substrate 14 by etching (e.g. in a solution comprising HF). This forms undercut cavities 52 which underlie the deformable layer 48.

In other embodiments of the present invention, the deformable layer 48 can be formed by a material removal process. This can be done, for example, by etching a plurality of trenches down into a monocrystalline silicon supporting substrate 14 to a predetermined depth. The trenches can then be filled by deposited silicon dioxide or silicate glass (e.g. TEOS), or alternately by thermally oxidizing the silicon substrate material to form silicon dioxide therefrom. The formation of a thermal oxide from a portion of the silicon substrate produces about twice the amount of the thermal oxide compared to the silicon which is consumed to form the thermal oxide. The deformable layer 48 can then be deposited over the supporting substrate 14 and the openings 50 formed therethrough to expose the underlying silicon. An isotropic etchant (e.g. xenon difluoride) can then be used to etch away the silicon underneath the deformable layer 48 and thereby form the undercut cavities 52 and leave the deformable layer 48 intact.

Figure 8A:
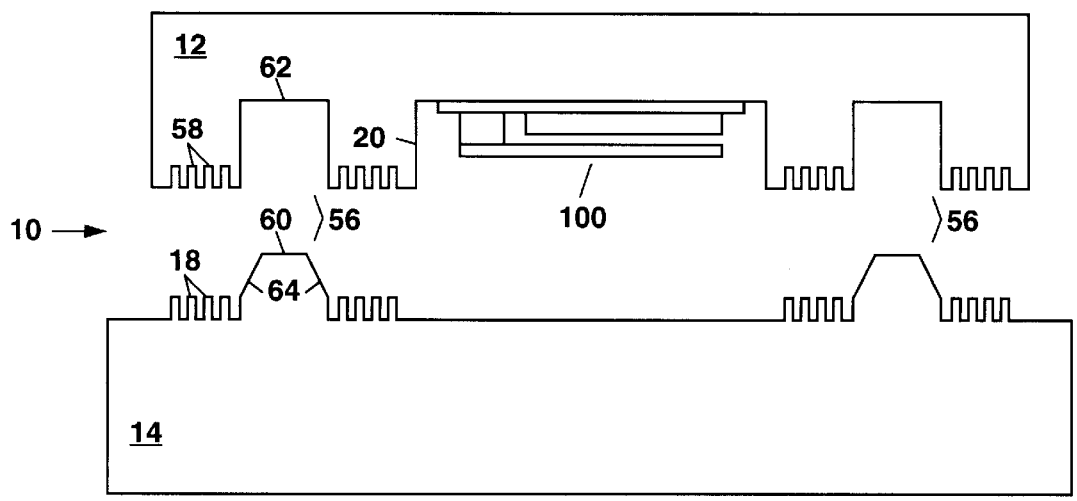
FIGS. 8A and 8B schematically illustrate a cross-sectional representation of a fourth example of the attachment structure of the present invention before and after engagement, respectively.
Figure 8B:
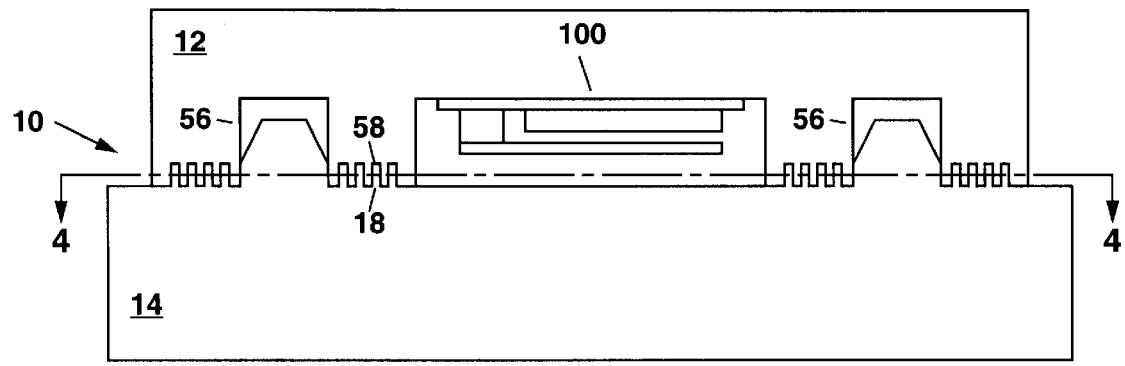
Figure 8C:
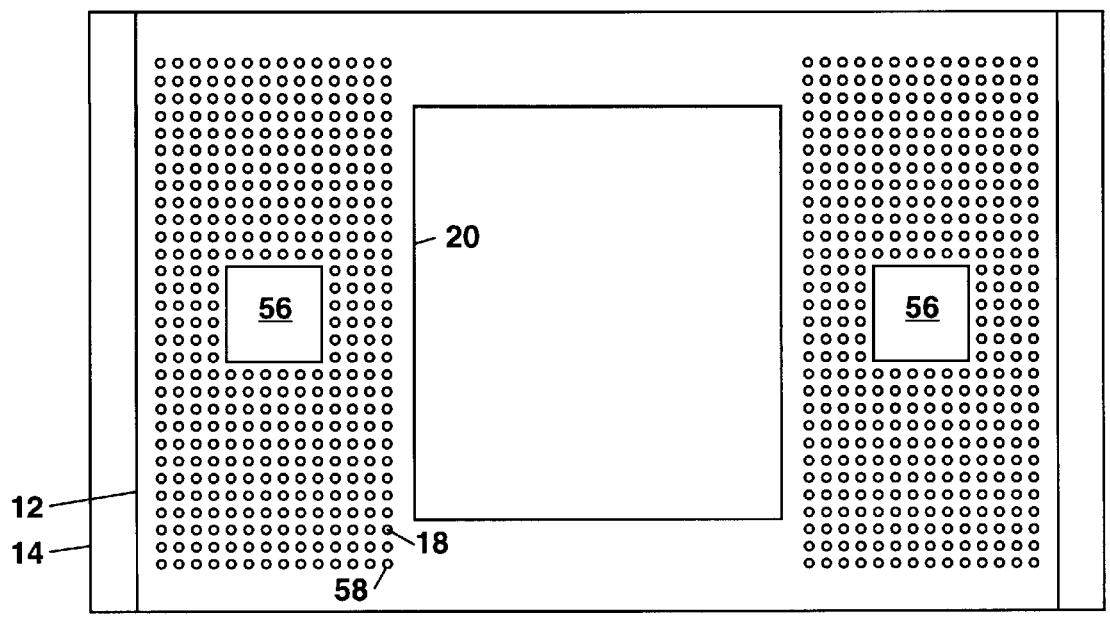
FIG. 8C shows a plan view of the engaged attachment structure along the section line 4—4 in FIG. 8B.

FIGS. 8A–8C show a fourth example of the attachment structure 10 of the present invention. The fourth example of the attachment structure 10 further includes an alignment structure 56 formed in part on the die 12 and in part on the supporting substrate 14. The alignment structure 56, which comprises a plurality of shaped pegs 60 and shaped recesses 62 as shown in FIG. 8A, is useful for easily and precisely positioning a plurality of shaped pillars 18 on the supporting substrate 14 to micron tolerances in order to mate with a plurality of receptacles 58 arrayed on the die 12. An alignment structure 56 can also be optionally added to each example of the present invention described heretofore.

In the alignment structure 56 of FIGS. 8A–8C, the shaped pegs 60 preferably have a length exceeding that of the pillars 18 so that the pegs 60 initially contact the lower surface of the die 12, with contact between the pillars 18 and the lower surface of the die 12 being prevented until a precise alignment is achieved so that each pillar 18 can mate with its corresponding receptacle 58. Since the width of the pegs 60 is greater than that of the receptacles 58, the die 12 can slide over the supporting substrate 14 until each peg 60 is coarsely aligned with its corresponding shaped recess 62. At this point, the die 12 and supporting substrate 14 can be urged together, with a plurality of sloped sidewalls 64 on the pegs 60 acting to further move the die 12 laterally into alignment with the supporting substrate 14. This action precisely aligns each pillar 18 with its corresponding receptacle 58 so that upon further urging, the pillars 18 enter their corresponding receptacles 58 to form the attachment between the die 12 and the supporting substrate 14 as shown in FIG. 8B. FIG. 8C shows a schematic plan view of the attached die 12 and supporting substrate 14 along the section line 4—4 in FIG. 8B.

Those skilled in the art will understand that other arrangements of the alignment structure 56 are possible. For example, the pegs 60 can be untapered; and the recesses 62 can include sloping sidewalls. The exact number and locations of the pegs 60 and recesses 62 is a matter of design choice.

FIGS. 9A–9D show a material removal method for fabricating the plurality of receptacles 58 and recesses 62 in the die 12 for attachment to the supporting substrate 14.

Figure 9A:
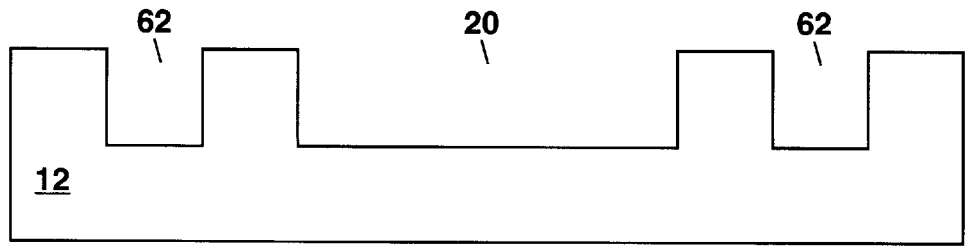
FIGS. 9A–9D schematically illustrate a process for forming a plurality of recesses and an array of receptacles on a surface of a die to form a part of the attachment structure of FIGS. 8A–8C.

In FIG. 9A, a cavity 20 and two recesses 62 are formed in the die 12. This can be done by photolithographically masking a plurality of die 12 on a substrate or wafer (not shown) and etching each cavity 20 and recess 62 using the same etching step (e.g. reactive ion etching which forms the cavity 20 and recesses 62 with substantially vertical sidewalls, or alternately an anisotropic wet etchant such as potassium hydroxide which forms the cavity 20 and recesses 62 with sloping sidewalls). In this way, the cavity 20 and recesses 62 are formed to the same depth which is generally in the range of 2–20 μm or more. Generally at least two recesses 62 must be formed on opposite ends of the die 12 for use in precisely aligning the die 12 to the supporting substrate 14. The recesses 62 can be formed as square openings in the die 12 as shown in FIG. 8C, with lateral dimensions (e.g. 10–1000 μm) that are generally large compared to the lateral dimensions of the receptacles 58 which are to be formed on the die 12.

In some embodiments of the present invention, the recesses 62 can be formed to a depth greater than that of the cavity 20. This can be done, for example, by anisotropically etching down into or completely through the die 12 from the bottom surface in FIG. 8A using an anisotropic wet etchant such as potassium hydroxide (KOH), tetramethyl ammonium hydroxide (TMAH) or ethylenediamine pyrocatechol (EDP) for a (100)-oriented silicon die 12. Etching down into the die 12 using an anisotropic wet etchant as described above will produce recesses 62 which have sidewalls that are tapered inward with increasing depth at an angle of about 55° from the surface of the die 12. Alternately, a deep reactive ion etching process as disclosed in U.S. Pat. No. 5,501,893 to Laermer et al, which has been previously described with reference to FIG. 2C, can be used. Such a deep reactive ion etching process can be used to etch down to hundreds of microns or even completely through the die 12. Etching the recesses 62 completely through the die 12 can be useful for allowing visual alignment of the pegs 60 to the recesses 62 using a microscope.

Figure 9B:
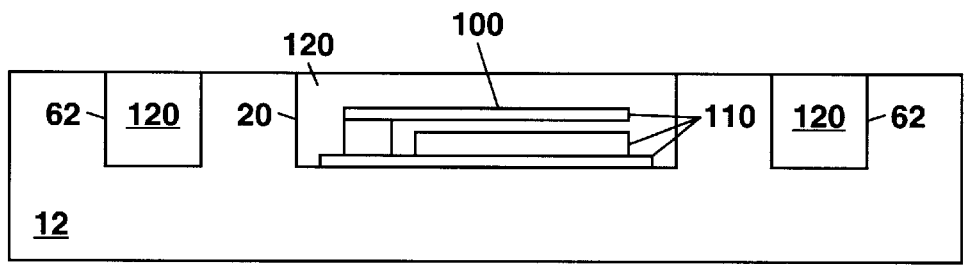
Figure 9C:
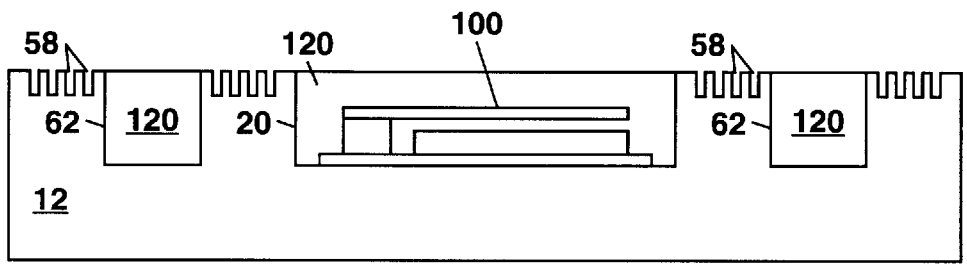

In FIG. 9B, a MEM device 100 is formed within the cavity 20 using a series of alternating steps for depositing and patterning polysilicon and a sacrificial material 120 (e.g. silicon dioxide or a silicate glass). During formation of the MEM device 100, the sacrificial material 120 is deposited to encapsulate each polysilicon layer and to fill the cavity 20. These same depositions of the sacrificial material 120 can also be used to fill in each recess 62. Once the MEM device 100 is completed and the cavity 20 and the recesses 62 are filled in with the sacrificial material 120, any of the sacrificial material 120 overlying the die 12 can be removed as described previously using masking and etching, or alternately using CMP In FIG. 9C, a plurality of shaped receptacles 58 can be formed in the die 12, with the receptacles 58 generally being arrayed about each recess 62 as shown in FIG. 8C. Each receptacle 58 can take the shape of a circular, square or polygonal cavity depending upon the shape of the mating pillars 18 to be formed on the supporting substrate 14. The lateral and vertical dimensions of each receptacle 58 can be, for example, in the range of 2–100 μm. In FIG. 9C, the receptacles 58 can be formed by patterning the same surface of the die 12 wherein the recesses 62 are formed. This can be done by providing a patterned mask (not shown) over the surface of the die 12 and then etching (e.g. using reactive ion etching) down into the die 12 through openings in the mask at the locations Wherein each receptacle 58 is to be formed. The receptacles 58 can be formed with substantially vertical inner sidewalls.

In other embodiments of the present invention, the receptacles 58 can be built up by a material addition process as described with reference to FIGS. 3A–3D. In this case, one or more notches or ridges can easily be formed about an inner sidewall of the cavity in the receptacles 58 using the process previously described with reference to FIGS. 4E and 4F.

Figure 9D:
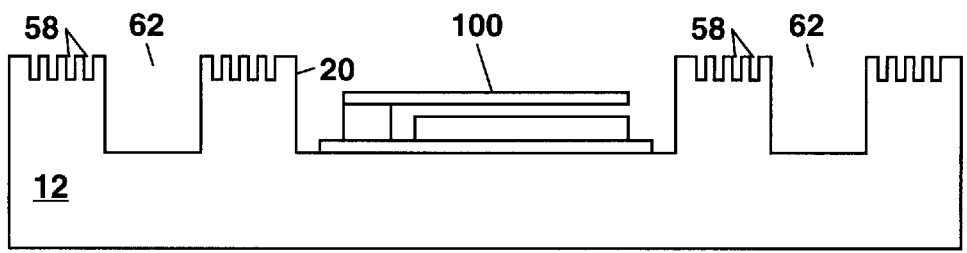

In FIG. 9D, the MEM device 100 can be released for operation by removing the sacrificial material 120 with a selective wet etchant (e.g. a solution comprising HF). This step also removes the sacrificial material 120 from each recess 62 and completes formation of the die 12 containing its portion of the attachment structure 10.

FIGS. 10A–10D illustrate a material removal method for forming a plurality of shaped pillars 18 on the supporting substrate 14, and a plurality of shaped alignment pegs 60 that are each shaped like a truncated pyramid.

Figure 10A:
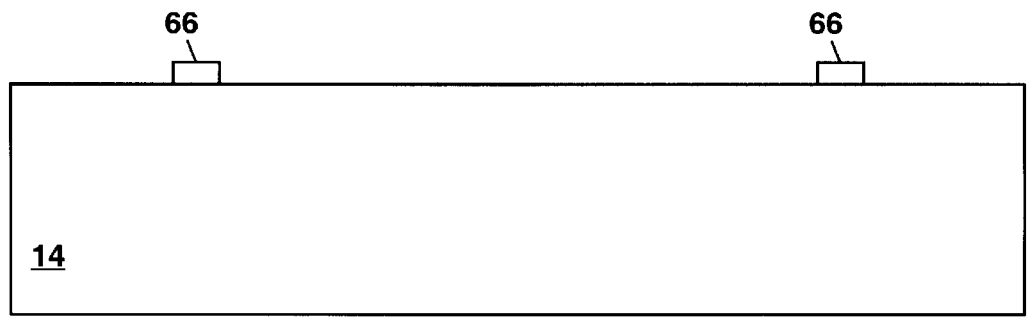
FIGS. 10A–10D schematically illustrate a process for forming a plurality of alignment pegs and an array of shaped pillars on a surface of a supporting substrate to form another part of the attachment structure of FIGS. 8A–8C.

In FIG. 10A, a patterned etch mask 66 can be formed on the supporting substrate 14 with openings to expose the substrate 14 at locations wherein material is to be removed. The substrate 14 can comprise (100)-oriented monocrystalline silicon.

Figure 10B:
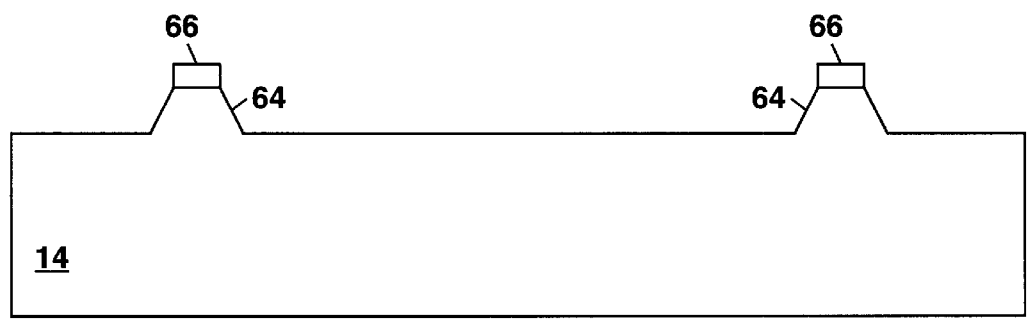

In FIG. 10B, an anisotropic wet etchant (e.g. KOH, TMAH or EDP) that substantially terminates etching upon reaching (111) crystalline planes of silicon is used to etch away a portion of the silicon substrate material, thereby forming truncated pyramids with sloping sidewalls 64 oriented at about 55° with respect to the upper surface of the supporting substrate 14. This etch step can be timed to provide a predetermined height for the truncated pyramids, with the height being smaller than the depth of the recesses 62 formed in the die 12. The etch mask 66 can then be removed from the supporting substrate 14.

Figure 10C:
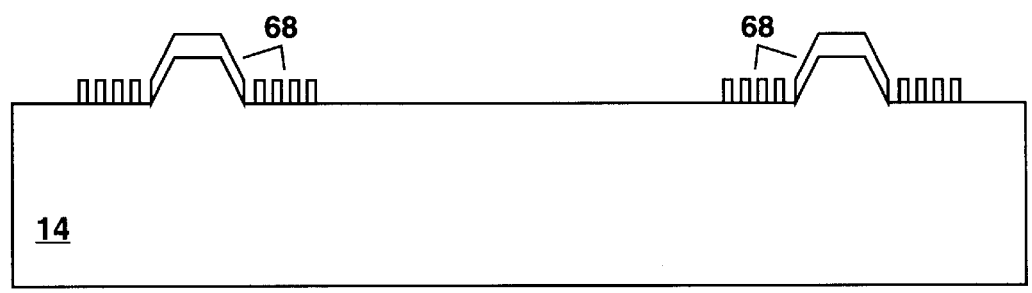

In FIG. 10C, a second etch mask 68 can be formed over the truncated pyramids, and over the locations wherein the shaped pillars 18 are to be formed from the substrate material. The second etch mask 68 can be a hard mask comprising, for example, 500 nm of TEOS. An anisotropic etching step can be performed (e.g. using reactive ion etching) to etch down through the supporting substrate 14 to a predetermined depth in the regions not covered by the etch mask 68. This forms the shaped pillars 18 which have a height that is about equal to that of the receptacles 58 formed in the die 12. The pillars 18 can optionally be made hollow or slotted or both depending upon a predetermined pattern used for the second etch mask 68.

In other embodiments of the present invention, the alignment pegs 60 and/or the pillars 18 can be formed by a material addition process as described previously with reference to FIGS. 3A–3D. In these embodiments, the pillars 18 can include one or more notches or ridges about an outer sidewall thereof, and can also be tapered (see FIGS. 4A–4C).

Figure 10D:
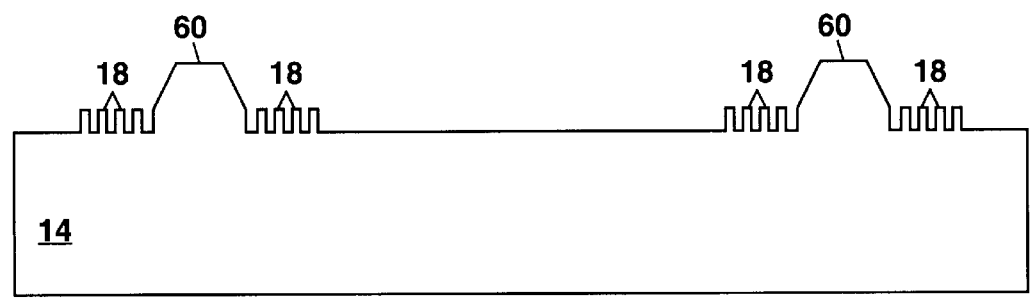

In FIG. 10D, removal of the second etch mask 68 then completes formation of the supporting substrate 14 with its alignment pegs 60 and shaped pillars 18.

In each of the examples described herein, it will be understood by those skilled in the art that the supporting substrate 14 can be attached to a conventional IC package (i.e. a header) prior to attachment of the die 12 to the supporting substrate 14. The attachment of the supporting substrate 14 to the conventional IC package can be performed, for example, using a eutectic metal (e.g. a solder) heated to an elevated temperature. Since the die 12 containing the MEM device 100, the microsensor, or the integrated circuitry is not present during the. process for attaching the supporting substrate 14 to the conventional IC package, no damage to any devices formed on the die 12 can occur. Attachment of the supporting substrate 14 to the conventional IC package using an adhesive (e.g. epoxy), however, is generally to be avoided since this can still lead to degradation of the devices on the die 12 after attachment of the die 12 to the supporting substrate 14.

In other embodiments of the present invention, the supporting substrate 14 can be the conventional IC package (e.g. comprising a ceramic, resin, or polymer material) patterned by etching, molding or replication to form a plurality of shaped pillars 18, a deformable layer 48 or an array of receptacles 58 on or above an upper surface thereof for attachment of a die 12 to the IC package without any adhesive or solder.

Figure 11:
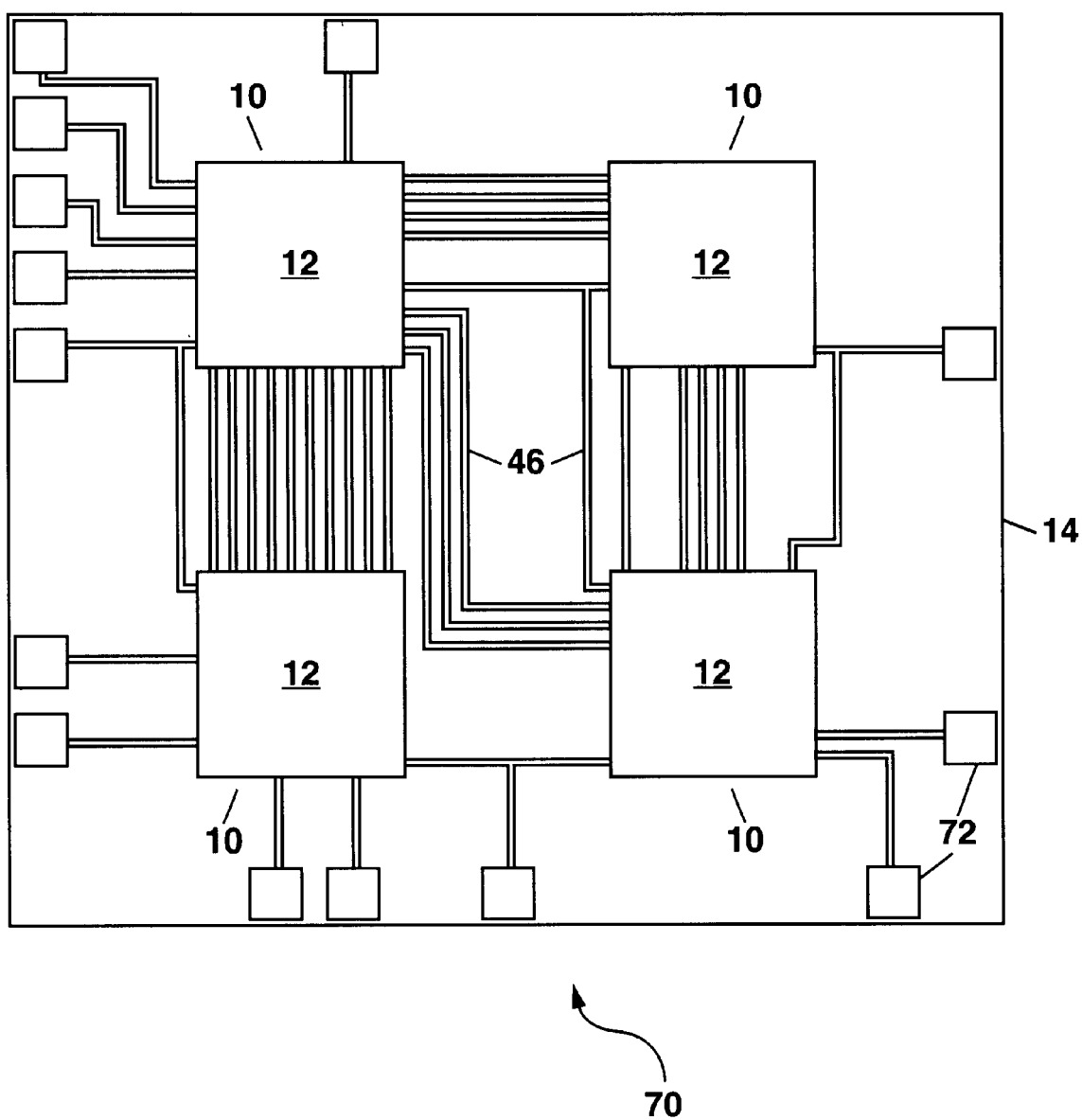
FIG. 11 schematically illustrates in plan view a multichip module formed using the attachment structure of the present invention to attach a plurality of die to a common supporting substrate.

Other applications and variations of the present invention will become evident to those skilled in the art. It will also be understood by those skilled in the art that the locations of the various elements of the attachment structure 10 can be reversed from that described in the examples given herein so that the description of an element of the attachment structure 10 formed on the die 12 can also apply to the supporting substrate 14 and vice versa. It will be further understood by those skilled in the art that the teachings of the present invention are applicable to the packaging of ICs, microsensors or multichip modules. A multichip module 70 can be formed using a plurality of attachment structures 10 as described heretofore, with each attachment structure 10 being used to secure a die 12 containing a MEM device 100, an IC or a microsensor to a common supporting substrate 14 as shown in the plan view of FIG. 11. A patterned interconnect metallization 46 on the substrate 14 can be used to electrically interconnect the various die 12 to each other and to a plurality of bond pads 72 formed on the substrate 14. The actual scope of the invention is intended to be defined in the following claims when viewed in their proper perspective based on the prior art.

What is claimed is:

1. A structure for attaching a pair of substrates together, with at least one of the substrates comprising a semiconductor, the structure comprising:

(a) a first plurality of shaped barbless pillars of a substantially uniform width extending outward from and supported by a first surface of a first substrate of a pair of substrates; and (b) engagement means formed on a second surface of a second substrate of the pair of substrates for engaging with the outward-extending barbless pillars and forming a mechanical attachment thereto when the first and second surfaces are urged together.

2. The structure of claim 1 wherein each pillar of the first plurality of shaped pillars has a cross-sectional shape in a plane parallel to the first surface that is circular, elliptical or polygonal.

3. The structure of claim 2 wherein each pillar of the first plurality of shaped pillars is tapered at an unsupported end thereof.

4. The structure of claim 2 wherein each pillar of the first plurality of shaped pillars is hollow.

5. The structure of claim 2 wherein each pillar of the first plurality of shaped pillars is slotted along a portion of the length thereof.

6. The structure of claim 2 wherein a sidewall of each pillar of the first plurality of shaped pillars is roughened.

7. The structure of claim 2 wherein a sidewall of each pillar of the first plurality of shaped pillars includes at least one ridge formed thereabout.

8. The structure of claim 2 wherein a sidewall of each pillar of the first plurality of shaped pillars includes at least one notch formed thereabout.

9. The structure of claim 1 wherein at least a portion of the first plurality of shaped pillars are electrically conductive.

10. The structure of claim 1 wherein the engagement means comprises a second plurality of shaped pillars, with the second plurality of shaped pillars extending outward from and being supported by the second surface of the second substrate.

11. The structure of claim 10 wherein each pillar of the second plurality of shaped pillars is tapered at an unsupported end thereof.

12. The structure of claim 10 wherein each pillar of the second plurality of shaped pillars is hollow.

13. The structure of claim 10 wherein each pillar of the second plurality of shaped pillars is slotted along a portion of the length thereof.

14. The structure of claim 10 wherein each pillar of the second plurality of shaped pillars has a substantially uniform width along a length thereof.

15. The structure of claim 10 wherein the second plurality of shaped pillars are substantially equal in size and shape to the first plurality of shaped pillars.

16. The structure of claim 10 wherein the second plurality of shaped pillars are unequal in size to the first plurality of shaped pillars.

17. The structure of claim 16 wherein each pillar of the second plurality of shaped pillars is hollow and is adapted to fit around or within a pillar of the first plurality of shaped pillars.

18. The structure of claim 10 wherein each pillar of the second plurality of shaped pillars has at least one ridge formed about a sidewall thereof, and each pillar of the first plurality of shaped pillars has at least one notch formed about one of the sidewalls thereof.

19. The structure of claim 10 wherein each pillar of the second plurality of shaped pillars has at least one notch formed about a sidewall thereof, and each pillar of the first plurality of shaped pillars has at least one ridge formed about one of the sidewalls thereof.

20. The structure of claim 1 wherein the engagement means comprises a deformable layer formed above the second surface of the second substrate, with the deformable layer having a plurality of openings therethrough superposed with the first plurality of shaped pillars.

21. The structure of claim 20 wherein each of the first plurality of shaped pillars is tapered at an unsupported end thereof.

22. The structure of claim 20 wherein each of the first plurality of shaped pillars has a ridge or notch formed about an outer sidewall thereof.

23. The structure of claim 1 wherein the engagement means comprises an array of receptacles formed on the second substrate, with each receptacle further comprising a cavity adapted to receive a mating pillar of the first plurality of shaped pillars.

24. The structure of claim 23 wherein each receptacle comprises a cavity having a width substantially equal to the width of the mating pillar.

25. The structure of claim 24 wherein each mating pillar is slotted along a portion, of the length thereof.

26. The structure of claim 23 wherein each receptacle includes a notch formed about an inner sidewall of the cavity, and the mating pillar includes a ridge formed about an outer sidewall thereof.

27. The structure of claim 23 wherein each receptacle includes a ridge formed about an inner sidewall of the cavity, and the mating pillar includes a notch formed about an outer sidewall thereof.

28. The structure of claim 1 further including an alignment structure formed on the first and second substrates for precisely positioning the first plurality of shaped pillars with the engagement means to facilitate formation of the mechanical attachment therebetween.

29. The structure of claim 28 wherein the alignment structure comprises a plurality of shaped pegs formed on one of the first and second substrates, and a plurality of shaped recesses for receiving the shaped pegs formed on the other of the first and second substrates.

30. The structure of claim 29 wherein each shaped peg is tapered at an unsupported end thereof.

31. The structure of claim 30 wherein the tapered end of each shaped peg is substantially flat.

32. The structure of claim 29 wherein each shaped peg has a length exceeding the length of each pillar of the first plurality of shaped pillars.

33. The structure of claim 29 wherein each shaped recess has a plurality of substantially vertical sidewalls.

34. The structure of claim 29 wherein each shaped recess has a plurality of sidewalls that are tapered inward with increasing depth.

35. A structure for attaching at least one semiconductor die to a supporting substrate, comprising:
   (a) a plurality of downward-extending barbless pillars having a substantially uniform width formed on a lower surface of each semiconductor die in a spaced arrangement; and
   (b) a plurality of upward-extending barbless pillars formed on an upper surface of the supporting substrate and spaced for engagement with the downward-extending pillars to provide a mechanical attachment of the upward-extending pillars with the downward-extending pillars.

36. The structure of claim 35 wherein the semiconductor die further includes a device selected from the group consisting of microelectromechanical devices, integrated circuit devices and microsensor devices formed on or below a surface thereof.

37. The structure of claim 36 wherein the device is formed on a portion of the semiconductor die which is free of the plurality of the downward-extending pillars.

* * * * *

UNITED STATES PATENT AND TRADEMARK OFFICE
CERTIFICATE OF CORRECTION

PATENT NO. : 6,392,144 B1
DATED : May 21, 2002
INVENTOR(S) : William F. Filter et al.

It is certified that error appears in the above-identified patent and that said Letters Patent is hereby corrected as shown below:

<u>Title page, Item [54] and Column 1, lines 1-2,</u>
Change "MICROMECHANICAL DIE ATTACHMENT SURCHARGE" to
-- MICROMECHANICAL DIE ATTACHMENT STRUCTURE --.

Signed and Sealed this

Nineteenth Day of November, 2002

Attest:

Attesting Officer

JAMES E. ROGAN
*Director of the United States Patent and Trademark Office*